US011158597B2

(12) United States Patent
Shiroi et al.

(10) Patent No.: US 11,158,597 B2
(45) Date of Patent: Oct. 26, 2021

(54) ELECTRONIC DEVICE INCLUDING THROUGH CONDUCTORS IN SEALING BODY

(71) Applicant: RENESAS ELECTRONICS CORPORATION, Tokyo (JP)

(72) Inventors: Wataru Shiroi, Tokyo (JP); Shuuichi Kariyazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/817,172

(22) Filed: Mar. 12, 2020

(65) Prior Publication Data

US 2020/0294954 A1    Sep. 17, 2020

(30) Foreign Application Priority Data

Mar. 15, 2019   (JP) .............................. JP2019-048036

(51) Int. Cl.
*H01L 23/31* (2006.01)
*H01L 23/00* (2006.01)

(52) U.S. Cl.
CPC .......... *H01L 24/45* (2013.01); *H01L 23/3121* (2013.01); *H01L 24/20* (2013.01); *H01L 2924/18165* (2013.01)

(58) Field of Classification Search
CPC ................. H01L 23/3121; H01L 24/20; H01L 2924/18165; H01L 24/45
USPC ......................................... 257/784; 438/617
See application file for complete search history.

(56) References Cited

U.S. PATENT DOCUMENTS

| 7,795,721 | B2 | 9/2010 | Kurita | |
|---|---|---|---|---|
| 9,799,611 | B2 | 10/2017 | Usami et al. | |
| 2014/0360767 | A1* | 12/2014 | Terui | H01L 23/5384 174/261 |
| 2018/0226349 | A1* | 8/2018 | Yu | H01L 21/565 |
| 2019/0131242 | A1* | 5/2019 | Lee | H01L 23/49833 |
| 2020/0135670 | A1* | 4/2020 | Hsu | H01L 24/19 |

FOREIGN PATENT DOCUMENTS

| JP | 2006-019433 A | 1/2006 |
|---|---|---|
| JP | 2015-195263 A | 11/2015 |

\* cited by examiner

*Primary Examiner* — Didarul A Mazumder
(74) *Attorney, Agent, or Firm* — McDermott Will & Emery LLP

(57) ABSTRACT

The electronic device includes first and second semiconductor components. And, the electronic device includes a sealing body for sealing the first semiconductor component (i.e., the logic chip). A plurality of through conductors electrically connected to the first semiconductor component and/or the second semiconductor component is formed in the sealing body. In plan view, the sealing body has a first region in which the first semiconductor component is located, a second region located on a periphery of a first surface of the sealing body, a third region located between the second region and the first region, and a fourth region located between the second region and the third region. The plurality of through conductors is arranged most in the second region. The number of the plurality of through conductors located in the third region is larger than the number of the plurality of through conductors located in the fourth region.

15 Claims, 14 Drawing Sheets

ELECTRONIC DEVICE INCLUDING THROUGH CONDUCTORS IN SEALING BODY

CROSS-REFERENCE TO RELATED APPLICATIONS

The disclosure of Japanese Patent Application No. 2019-048036 filed on Mar. 15, 2019 including the specification, drawings and abstract is incorporated herein by reference in its entirety.

BACKGROUND

The present invention relates to an electronic device including a plurality of semiconductor components, and, for example, the present invention relates to a technique useful for application to an electronic device including a plurality of semiconductor components electrically connected to each other.

The Background of the Invention

Patent Document 1 and Patent Document 2 disclose an electronic device in which semiconductor chips (semiconductor elements) are mounted on the upper surface and bottom surfaces of a wiring substrate (wiring member), respectively.

There are disclosed techniques listed below.
[Patent Document 1] Japanese Unexamined Patent Application Publication No. 2006-19433
[Patent Document 2] Japanese Unexamined Patent Application Publication No. 2015-195263

SUMMARY

The present inventors have developed an electronic device in which a plurality of semiconductor components is electrically connected with each other via a wiring portion. As a part of this, an electronic device in which the plurality of semiconductor components is mounted on both sides of a wire portion and a plurality of semiconductor components is electrically connected with each other was examined. Since the electronic device can shorten a signal-transmitting path for electrically connecting a plurality of semiconductor components with each other, a signal-transmitting quality between the plurality of semiconductor components can be improved. However, according to the study by the inventors of the present application, it has become clear that there is room for improvement in order to improve the performance of the electronic device, for example, the transmission characteristics of the power supply path to the semiconductor component, the transmission characteristics of the signal-transmitting path, or the like.

Other objects and novel features will become apparent from the description of this specification and the accompanying drawings.

An electronic device according to an embodiment includes first and second semiconductor components. And, the electronic device includes a sealing body for sealing the first semiconductor component (i.e., the logic chip). A plurality of through conductors electrically connected to the first semiconductor component and/or the second semiconductor component is formed in the sealing body. In plan view, the sealing body has a first region in which the first semiconductor component is located, a second region located on a periphery of a first surface of the sealing body, a third region located between the second region and the first region, and a fourth region located between the second region and the third region. The plurality of through conductors is arranged most in the second region. The number of the plurality of through conductors located in the third region is larger than the number of the plurality of through conductors located in the fourth region.

According to the above embodiment, the performance of the electronic device can be improved.

Figure 1:
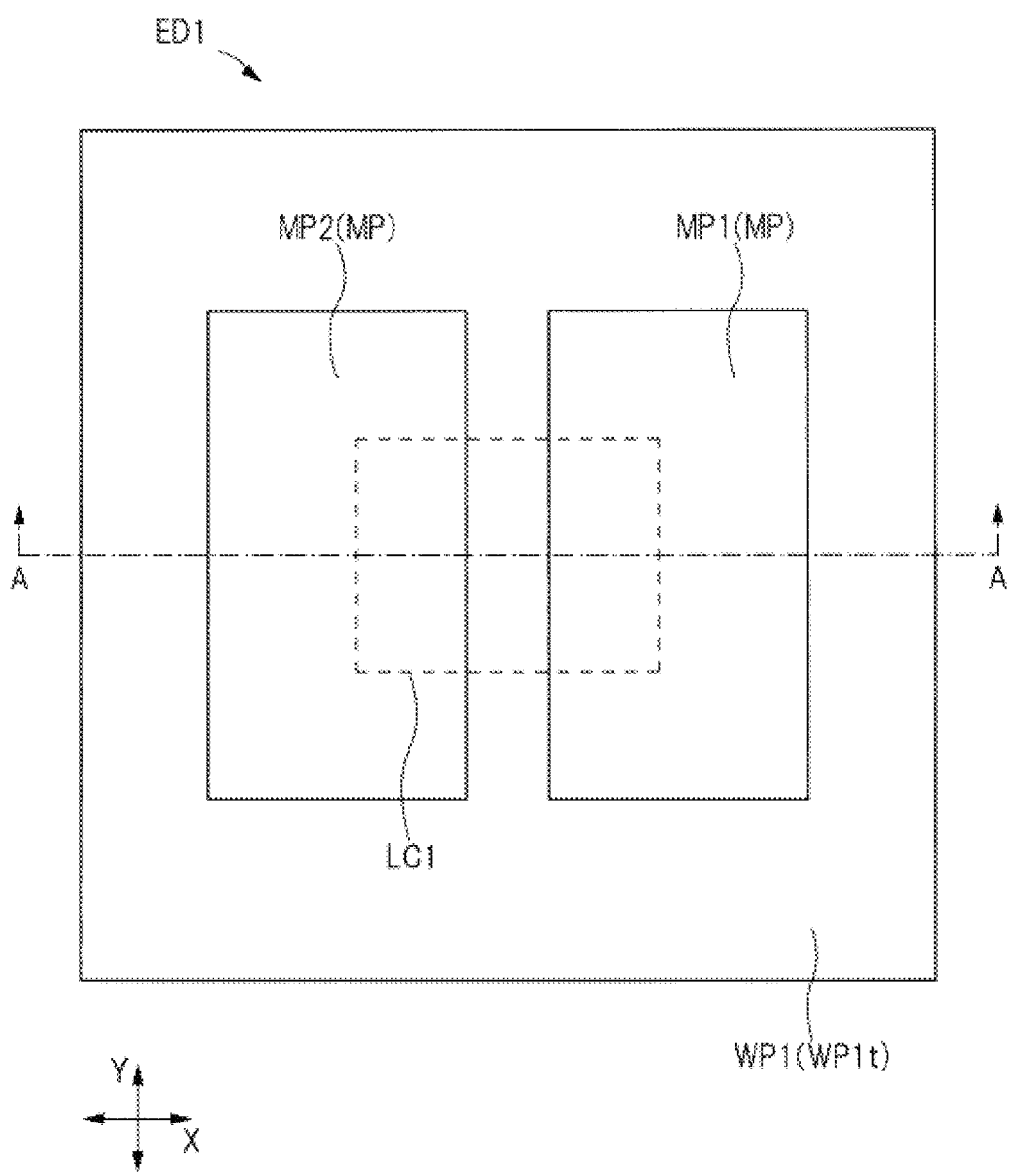
FIG. 1 is an upper surface diagram of an electronic device according to an embodiment.

DETAILED DESCRIPTION (Explanation of Description Format, Basic Terminology and Usage in Present Application)

In the present application, descriptions of embodiments will be divided into a plurality of sections or the like for convenience of description, as required, except where expressly stated otherwise, these are not independent from each other, and each part of a single example, one of which is a modified example of some detail, part or all of the other, whether before or after the description. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, the term "silicon member" or the like is not limited to pure silicon, and it is needless to say that it also includes a member containing a SiGe (silicon-germanium) alloy, a multi-element alloy containing silicon as its main component, other additives, or the like. In addition, the gold plating, Cu layer, nickel plating, and the like include not only pure materials, but also members containing gold, Cu, nickel, and the like as main components, respectively, unless otherwise specified.

In addition, reference to a specific numerical value or quantity may be greater than or less than that specific numerical value, unless expressly stated otherwise, theoretically limited to that number, and obviously not so from the context. In the following description, a certain value and another value may be referred to as "the same" or "the same", but the meaning of "the same" or "the same" includes strictly the same cases as well as cases in which there is an error within a range that can be considered to be substantially equivalent.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that the region is not a void, even if it is not a cross-section, or to indicate the boundary of the area.

<Electronic Device>

Figure 2:
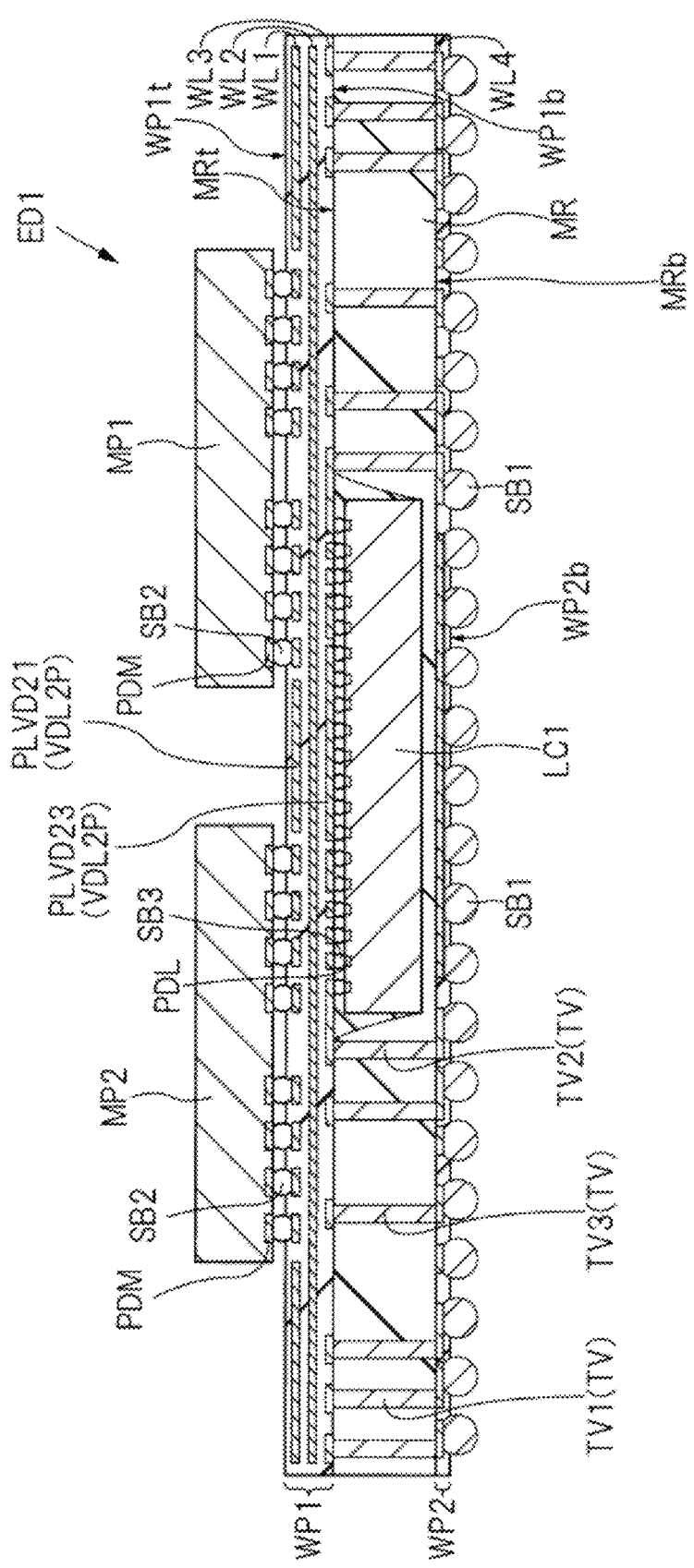
FIG. 2 is a cross-sectional view taken along line A-A of FIG. 1.
Figure 3:
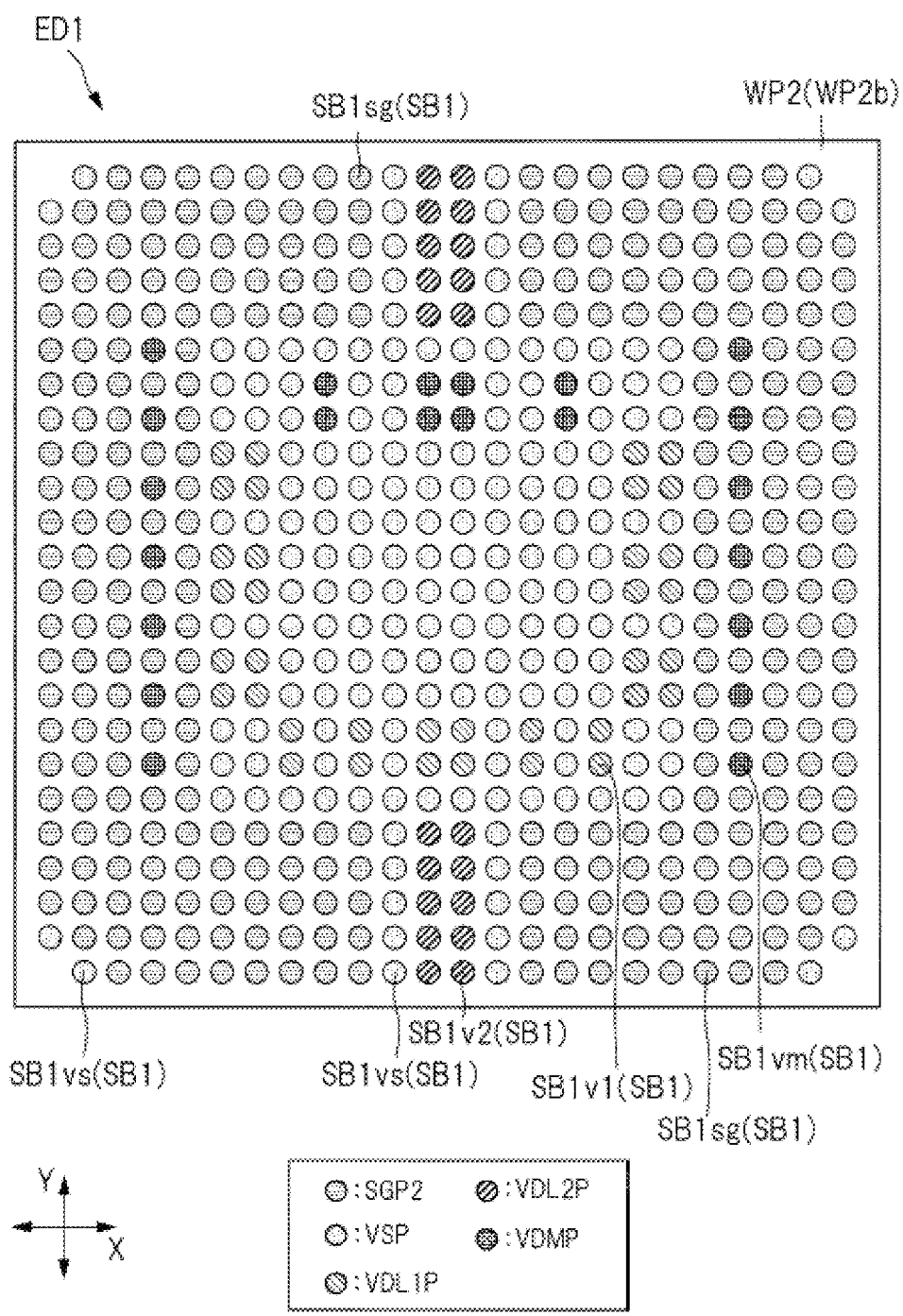
FIG. 3 is a lower surface view of the electronic device shown in FIG. 1.
Figure 4:
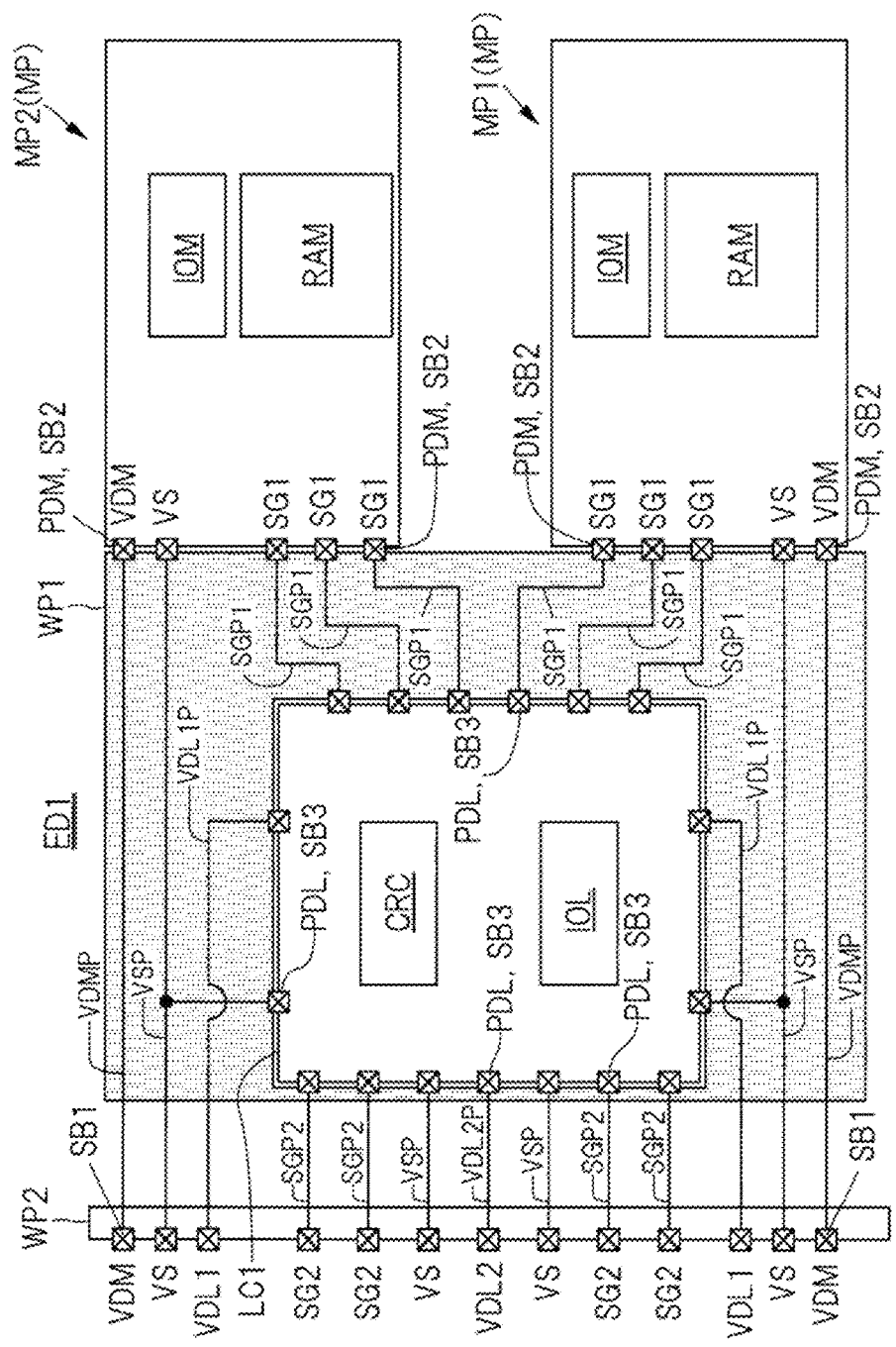
FIG. 4 is a circuit diagram showing an exemplary circuit configuration of the electronic device shown in FIG. 2.

First, a schematic configuration of the present embodiment electronic device ED1 will be described with reference to FIGS. 1 to 4. FIG. 1 is an upper surface diagram of an electronic device of a present embodiment. In FIG. 1, the outline of the logic chip LC1 mounted on the surface of the interconnection portion WP1 opposite to the upper surface WP1*t* on which the memory components MP1 and MP2 are mounted is shown by a dotted line. FIG. 2 is a cross-sectional view taken along line A-A of FIG. 1. FIG. 3 is a lower surface view of the electronic device shown in FIG. 1. Although FIG. 3 is a plan view, each of the plurality of soldering balls SB1 is patterned. The pattern attached to the solder ball SB1 is distinguished according to the type of current flowing, for example, for transmitting signals, for supplying a power supply potential, for supplying a reference potential, and the like. FIG. 3 shows a legend of the type of soldering ball SB1 below the plan view. FIG. 4 is a circuit diagram showing an exemplary circuit configuration of the electronic device shown in FIG. 2. In FIG. 4, in order to clearly indicate the extent of the wiring portion WP1, a pattern is attached to a portion corresponding to the wiring portion WP1.

As shown in FIGS. 1 and 2, the electronic device ED1 of the present embodiment includes a logic chip (semiconductor chip, semiconductor component, semiconductor device) LC1 mounted on opposite sides of the wiring portion WP1, and memory components (semiconductor component, memory package, semiconductor device) MP1 and MP2. Although not shown, the logic chip LC1 includes a semiconductor substrate, a plurality of semiconductor elements formed on the semiconductor substrate, wires connected to the semiconductor elements, and a plurality of terminals (electrodes, electrode pads) PDL (refer to FIG. 2) connected to the semiconductor elements via the wirings. In the embodiment shown in FIG. 2, the plurality of terminals PDL of the logic chip LC1 are formed on the upper surface (front surface) of the logic chip LC1, and are not formed on the lower surface (back surface).

Each of the memory components MP1 and MP2 is a memory package in which a plurality of memory chips is stacked and packaged. Each of the plurality of memory chips includes a storage circuit called DRAM (Dynamic Random Access Memory). The memory circuit corresponds to the memory circuit RAM shown in FIG. 4. Each of the memory components MP1 and MP2 has a plurality of terminals (electrodes and electrode pads) PDMs electrically connected to the memory circuit RAM (see FIG. 4). In the embodiment shown in FIG. 2, the plurality of terminals PDM included in each of the plurality of memory components MP are formed on the lower surface of the memory component MP and are not formed on the upper surface.

It should be noted that the configuration of the logic chip LC1 and the plurality of memory components MPs have various modified example other than the above-described examples. For example, a semiconductor package in which one or a plurality of semiconductor chips are packaged may be mounted at the position of the logic chip LC1 shown in FIG. 2. Further, for example, a memory chip composed of a single semiconductor chip may be mounted at the position of the memory component MP. In the present embodiment examples, the number of memory components MPs is two. The number of memory components MP may be, for example, one or three or more.

As shown in FIG. 2, the electronic device ED1 includes a wiring portion WP1 formed on the upper surface MRt of the sealing body MR (see FIG. 2) and a wiring portion WP2 formed on the lower surface MRb of the sealing body MR (see FIG. 2). The logic chip LC1 is mounted on the lower surface WP1*b* of the interconnection portion WP1. The memory components MP1 and MP2 are mounted on the upper surface WP1*t* of the wiring portion WP1. The electronic device ED1 has a sealing body MR that seals the logic chip LC1 and a plurality of through conductors TV that penetrate through the sealing body MR and electrically connect the wiring portion WP1 and the wiring portion WP2, the sealing body MR having a lower surface MRb that is located on opposite sides of the upper surface MRt and the upper surface MRt.

As shown in FIG. 1, in a plan view, the logic chip LC1 is arranged in a central area on the lower surface WP1*b* of the interconnection portion WP1 (refer to FIG. 2). Each of the memory component MP1 and the memory component MP2 is mounted on the upper surface WP1*t* and arranged at a position overlapping with the logic chip LC1. The memory component MP1 and the memory component MP2 are arranged so as to be separated from each other. In plan view, a part of the area sandwiched between the memory component MP1 and the memory component MP2 overlaps with the logic chip LC1. As will be described in detail later, the interconnection portion WP1 shown in FIG. 2 includes a conductive pattern PLVD21 included in the supply path of the power supply potential at positions overlapping with regions sandwiched between the memory component MP1 and the memory component MP2.

As shown in FIG. 2, each of the memory components MP1 and MP2 is mounted on the upper surface WP1*t* of the wiring portion WP1 with the surface on which the plurality of terminals PDMs are provided facing the upper surface WP1*t* of the wiring portion WP1. Each of the plurality of terminals PDM is electrically connected to the conductive patterns formed in the uppermost wiring layer of the wiring portion WP1 via, for example, solder bumps (bumps, connecting terminals) SB2. The logic chip LC1 is mounted on the lower surface WP1b of the wiring portion WP1 with the surface on which the plurality of terminals PDL are provided facing the lower surface WP1b of the wiring portion WP1. Each of the plurality of terminals PDL is electrically connected to the conductive patterns formed in the lowermost wiring layer of the wiring portion WP1 via, for example, solder bumps SB3.

In the present embodiment, the connecting terminals described as the solder bumps SB2 and the solder bumps SB3 have various modified example. Instead of the solder bumps SB2 and the solder bumps SB3, for example, a copper pillar made of a metallic member formed in a columnar shape may be used. The solder bumps SB2 can be regarded as external terminals of the memory components MP1 and MP2. The solder bump SB3 can be regarded as an external terminal of the logic chip LC1.

Each of the memory component MP1 and the memory component MP2 is electrically connected to the logic chip LC1 via the interconnection portion WP1. In the present embodiment, the wiring portion WP1 includes a plurality of wiring layers stacked in the thickness directions. In the embodiment shown in FIG. 2, the wiring portion WP1 includes three wiring layers stacked in the order of the wiring layer WL1, WL2 and the WL3 from the upper surface WP1t. The electrode pads of the logic chip LC1 and the terminals of the memory components MP1 and MP2 are electrically connected to each other through a plurality of wiring layers WL1, WL2 and WL3 of the wiring portion WP1.

The logic chip LC1 is electrically connected to the wiring portion WP2 via the wiring portion WP1 and the plurality of through conductors TV. A plurality of soldering balls (external terminals and terminals) SB1 are connected to the interconnection portion WP2. Each of the plurality of solder balls SB1 is an external terminal of the electronic device ED1. When the electronic device ED1 is electrically connected to an external device (not shown), a signal transmitted to the external device is outputted, a signal transmitted from the external device is inputted, or driving power is supplied to various circuits included in the electronic device ED1 via a soldering ball SB1 which is an external terminal. As shown in FIG. 3, the plurality of solder balls SB1 are arranged on the lower surface WP2b of the interconnect portion WP2. In the embodiment shown in FIG. 3, the plurality of soldering balls SB1 are arranged in a matrix. The layouts for each type of the plurality of solder balls SB1 will be described later.

As shown in FIG. 4, each of the plurality of memory components MP includes a memory circuit RAM and an input/output circuit IOM for performing an input/output operation of a data signal to/from the memory circuit RAM. The logic chip LC1 electrically connected to each of the plurality of memory components MP includes a core circuit CRC and an input/output circuit IOL for performing an input/output operation of data signals to/from the core circuit CRC. The core circuit CRC includes, for example, a control circuit that controls the operation of the memory circuit RAM of the memory component MP, or an arithmetic processing circuit that performs arithmetic processing on a data signal.

Each of the memory component MP1 and the memory component MP2 has a plurality of signal-transmitting paths SGP1 for transmitting a signal (electric signal) SG1 between the memory components and the logic chip LC1. The plurality of signal-transmitting paths SGP1 include, for example, a data signal-transmitting path for transmitting a data signal, a clock signal-transmitting path for transmitting a clock signal for synchronizing operation timings, and a control signal-transmitting path for transmitting a control signal for controlling an input/output operation. The signal-transmitting path SGP1 is formed mainly in the wiring portion WP1, and one end of the signal-transmitting path SGP1 is connected to the terminal PDL of the logic chip, and the other end of the signal-transmitting path SGP1 is connected to the terminal PDM of the memory component MP. Most of the signal-transmission paths connected to the memory component MP is connected to the logic chip LC1. In the embodiment shown in FIG. 4, all the signal-transmitting paths connected to the memory component MP is connected to the logic chip LC1. In other words, in the embodiment shown in FIG. 4, there is no signal-transmitting path that connects the memory component MP and the wiring portion WP2 without the logic chip LC1. However, as a modified example to FIG. 4, there may be a signal-transmitting path that connects the memory component MP and the wiring portion WP2 without using the logic chip LC1. For example, this corresponds to a signal-transmitting path used when the operation confirmation test of the memory component MP is performed. Even in this case, most of the signal-transmitting paths connected to the memory component MP is connected to the logic chip LC1.

Each of the memory components MP1 and MP2 has a power supply potential supply path VDMP to which a power supply potential VDM for driving the memory circuit RAM is supplied and a reference potential supply path VSP to which a reference potential VS is supplied. In the example shown in FIG. 4, the potential difference between the power supply potential VDM and the reference potential VS corresponds to the drive voltage for driving the memory circuit RAM. The reference potential VS is, for example, a potential having a value different from the power supply potential, such as a ground potential (GND potential). In FIG. 4, as an example, one type of power supply potential VDM is supplied to the memory component MP. However, as a modified example, a plurality of types of power supply potentials having different potentials from each other and different from the reference potential V S may be supplied to the memory component MP.

The power supply potential supply path VDMP and the reference potential supply path VSP are connected to a solder ball SB1, which is an external terminal attached to the wiring portion WP2, via the wiring portion WP1 and the through conductor TV shown in FIG. 2.

The power supply potential supply path VDMP to which the power supply potential VDM is supplied is a power supply path for driving the memory component MP, and therefore, the memory component MP does not pass through the logic chip LC1. More specifically, the power supply potential supply path VDMP is connected to each of the memory component MP1 and the memory component MP2 from the wiring portion WP2 to which the solder ball SB1 serving as an external terminal is attached, not via the logic chip LC1, but via the wiring portion WP1.

The reference potential supply path VSP to which the reference potential VS is supplied is electrically connected to a path for supplying the reference potential to the logic chip LC1. In the embodiment shown in FIG. 4, the reference potential supplying path VSP connected to the interconnection portion WP2 is branched into a plurality of paths, and a part of the branched path VSP is connected to the logic chip LC1, and the other portion is connected to each of the memory component MP1 and the memory component MP2.

The logic chip LC1 includes a power supply potential supply path VDL1P for supplying a power supply potential VDL1 for driving the input/output circuit IOL, and a power supply potential supply path VDL2P for supplying a power supply potential VDL2 for driving the core circuit CRC. In the embodiment shown in FIG. 4, a potential difference between the power supply potential VDL1 and the reference potential VS corresponds to a driving voltage for driving the input/output circuit IOL. The potential difference between the power supply potential VDL2 and the reference potential VS corresponds to a driving voltage for driving the core circuit CRC. In FIG. 4, as an example, only the power supply potential VDL2 is exemplarily shown as the potential for driving the core circuit CRC. However, the core circuit CRC includes various circuits such as the arithmetic processing circuit or the control circuit described above, and a plurality of these circuits may be driven by different voltages. In this case, a plurality of types of power supply potentials different from each other and different from the reference potential VS may be supplied as the power supply potentials for driving the core circuit CRC.

The logic chip LC1 has a plurality of signal-transmitting paths SGP1 for transmitting a signal (electric signal) SG1 to and from the memory component MP1 or the memory component MP2. The logic chip LC1 has a plurality of signal-transmitting paths SGP2 for transmitting a signal (electric signal) SG2 to and from an external device (not shown). The signal-transmitting path SGP2 is formed in the wiring portion WP1, the plurality of through conductors TV shown in FIG. 3, and the wiring portion WP2, and one end of the signal-transmitting path SGP2 is connected to the terminal PDL of the logic chip, and the other end of the signal-transmitting path SGP2 is connected to each of the plurality of solder balls SB1 connected to the wiring portion WP2. The logic chip LC1 includes a plurality of signal-transmitting paths SGP1 connected to the memory components MP1 and MP2, and a plurality of signal-transmitting paths SGP2 connected to a plurality of solder balls SB1 which are external terminals without passing through the memory components MP1 and MP2.

Though not shown, as a comparative example to the present embodiment electronic device ED1, there is an electronic device in which a logic chip LC1 and a plurality of memory components MP are respectively mounted on the same surface of a wiring substrate (not shown). The performance of the present embodiment electronic device ED1 can be improved from the viewpoint of signal transmission characteristics or heat dissipation, compared with the electronic device of the comparative examples.

For example, as shown in FIG. 2, in the electronic device ED1, the logic chip LC1 and the memory components MP are mounted on mutually opposing surfaces of the wiring portion WP1. As described with reference to FIG. 1, the logic chip LC1 and the memory components MP overlap each other in a transparent plan view. In this instance, the path distances of the plurality of signal-transmitting paths SGP1 (refer to FIG. 4) for electrically connecting the plurality of terminals PDL (see FIG. 2) of the logic chip LC1 and the plurality of terminals PDM (see FIG. 2) of the memory component MP can be shortened.

For example, in the electronic device ED1, the logic chip LC1 that generate more heat during driving than the memory components MP are disposed between the wiring portions WP1, WP2. Since the plurality of signal-transmitting paths SGP1 shown in FIG. 4 are formed in the wiring portion WP1, the wiring portion WP2 does not need to be multi-layered. In the embodiment shown in FIG. 2, the wiring portion WP2 is composed of a single wiring layer WL4. In this instance, since the thickness of the interconnection portion WP2 can be reduced, the distances of the heat radiation paths from the logic chip LC1 to the outside can be shortened. Therefore, the present embodiment electronic device ED1 can improve heat dissipation characteristics with respect to the electronic device of the comparative examples described above in which the logic chip LC1 is mounted on the thicker interconnection substrate. Even when the logic chip LC1 is mounted on the interconnection substrate, if heat dissipation components such as fans or heat sinks can be disposed on the logic chip LC1, heat dissipation can be improved. However, depending on the application of the electronic device, it may be difficult to arrange the heat dissipation component on the interconnect substrate. For example, in the case of an electronic device having a small volume in a case, such as a surveillance camera device, it is difficult to secure a space for arranging a heat radiation component. The construction of the present embodiment is particularly useful when it is difficult to secure the space for arranging the heat dissipation components as described above.

<Layout of Through Conductor>

In the electronic device ED1, as shown in FIG. 4, the signal-transmitting path SGP1, SGP2, the power supply potential supply path VDMP, VDL1P, VDL2P, and the reference potential supply path VSP are formed in the wiring portion WP1. Therefore, from the viewpoint of miniaturization of the electronic device ED1, it is preferable to efficiently arrange a large number of wirings. In addition, from the viewpoint of stably operating the various circuits included in the electronic device ED1, it is preferable to reduce transmission loss of the supply path of the drive voltages for driving the various circuits.

Figure 5:
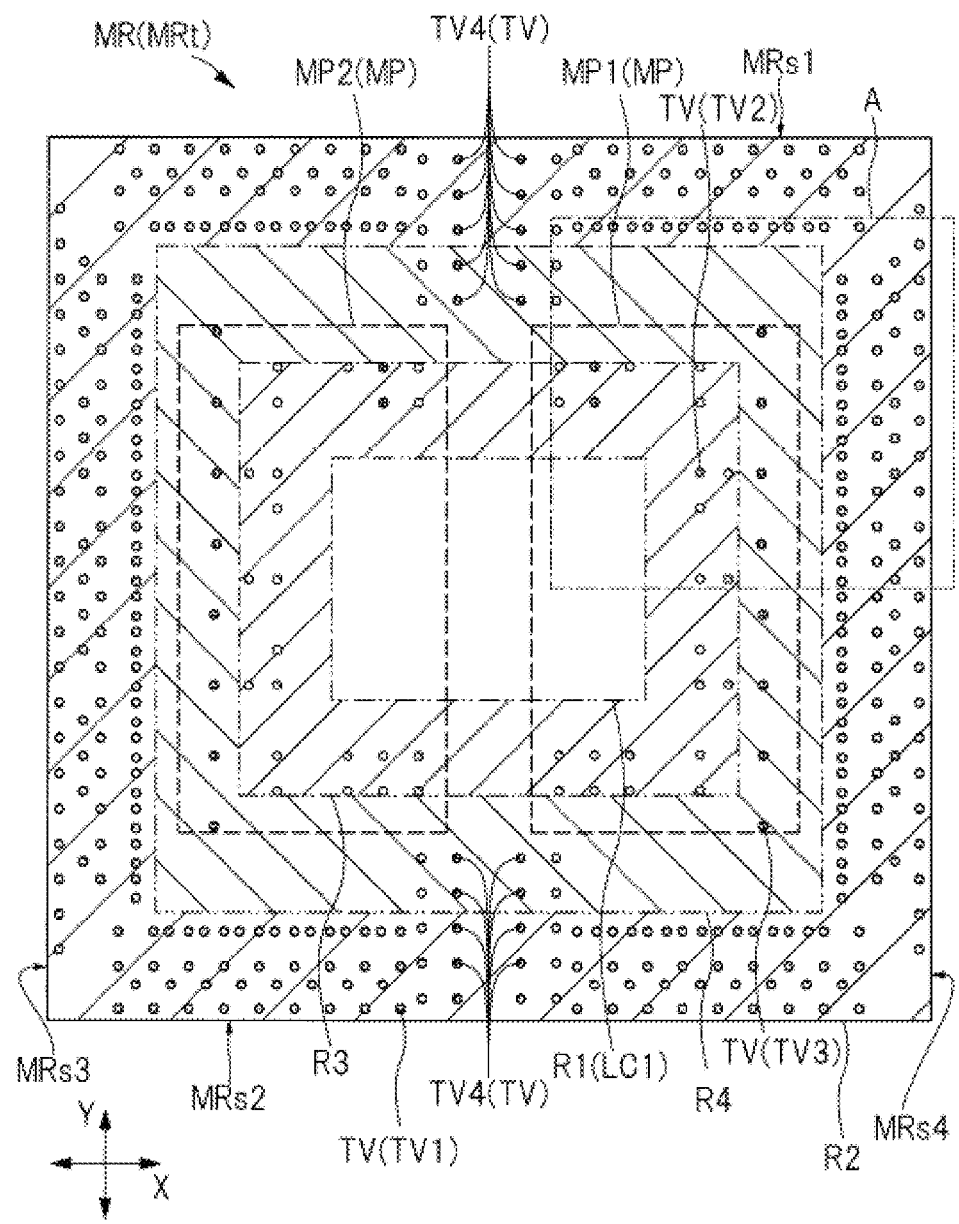
FIG. 5 is a plan view when the sealing body shown in FIG. 2 is viewed from the upper surface side.
Figure 6:
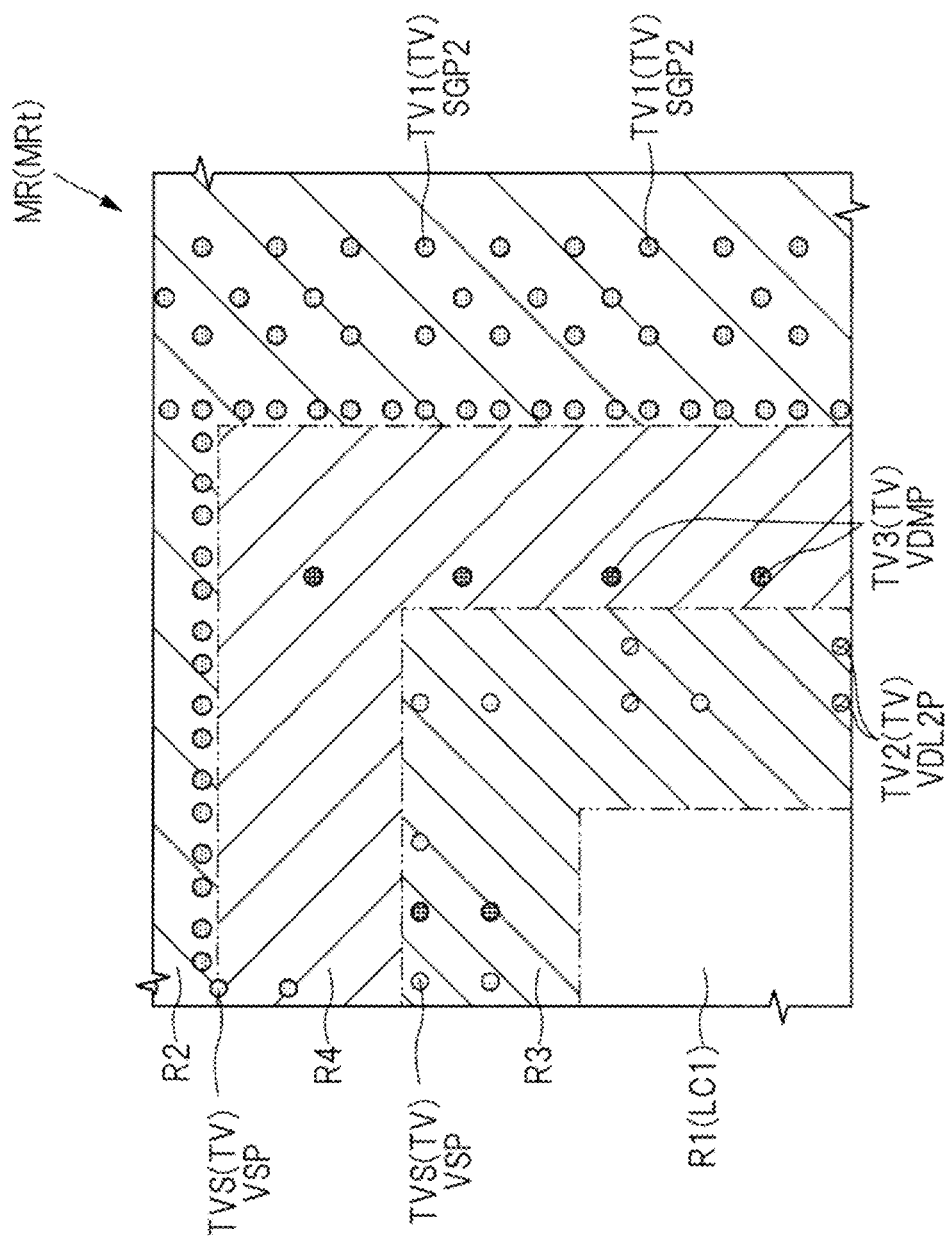
FIG. 6 is an enlarged plan view of part A of FIG. 5.

FIG. 5 is a plan view when the sealing body shown in FIG. 2 is viewed from the upper surface side. FIG. 6 is an enlarged plan view of part A of FIG. 5. Although FIGS. 5 and 6 are plan view, each of the regions R2, R3, and R4 is hatched differently in order to specify the extent of the regions R1, R2, R3, and R4. In FIGS. 5 and 6, in order to make it easy to distinguish the type of current flowing through the plurality of through conductor TV, a pattern is applied to the respective through conductor TV. The distinction between the pattern attached to the through conductor TV is the same as the legend of the type of the solder ball SB1 shown in FIG. 3.

As shown in FIG. 5, in a transparent plan view seen from the upper surface MRt side of the sealing body MR, the upper surface MRt includes a region R1 in which the logic chip LC1 is arranged, a region R2 located on the peripheral edge side of the upper surface MRt, a region R3 located between the region R2 and the region R1, and a region R4 located between the region R2 and the region R3.

In each of the regions R2, R3, and R4, a plurality of through conductors TV (see FIG. 2) are arranged. Since the logic chip LC1 is arranged in the region R1, the through conductors TV are not arranged in the area R1. In the regions R2, R3, and R4, the arrangement densities of each through conductor TV are different from each other. More specifically, as shown in FIG. 6, the number of the plurality of through conductors TV arranged in the region R2 is larger than the number of the plurality of through conductors TV arranged in the region R3 and the number of the plurality of through conductors TV arranged in the region R4, respectively. The number of the plurality of through conductors TV arranged in the region R3 is larger than the number of the plurality of through conductors TV arranged in the region R4. The number of the through conductors TV arranged in each of the above-mentioned regions can be expressed as follows. That is, the arrangement density of the plurality of through conductors TV arranged in the region R2 is higher than the arrangement density of the plurality of through conductors TV arranged in the region R3 and the region R4. The arrangement density of the plurality of through conductors TV arranged in the region R4 is lower than the arrangement density of the plurality of through conductors TV arranged in the region R3.

In the present embodiment, as shown in FIG. 2, the external interface of each of the logic chip LC1, the memory component MP1 and the memory component MP2 is a plurality of solder balls SB1 that are attached to the interconnect WP2. The paths for electrically connecting each of the logic chip LC1, the memory components MP1 and the memory component MP2 and the plurality of solder balls SB1 with each other must pass through the interconnection portion WP1 and the through conductors TV. Accordingly, the wiring portion WP1 includes a plurality of wires for electrically connecting each of the logic chip LC1, the memory component MP1 and the memory component MP2 and the plurality of solder balls SB1. The multiple wires include, for example, wirings WSG2 and WV1 shown in FIG. 7, which will be described later.

In order to reduce the mounting area of the electronic device ED1 in which the number of external terminals tends to increase along with the increase in the number of functions, as shown in FIG. 3, it is preferable to arrange the solder balls SB1 in a matrix form in the central portion and the peripheral portion of the interconnect portion WP2. As is clear from FIG. 3, the closer to the peripheral portion of the wire portion WP2, the larger the space in which the solder ball SB1 can be disposed. As a result, when the electronic device ED1 is miniaturized, the number of solder balls SB1 disposed on the peripheral portion side of the wiring portion WP2 is larger than the number of solder balls SB1 disposed on the central portion side of the wiring portion WP2.

Further, in order to reduce the number of wiring layers in the wiring portion WP1, it is preferable to increase the arrangement density of the wirings and to route the wirings drawn from the logic chip LC1 by a single wiring layer. In the wiring layers WL3 shown in FIG. 2, a region overlapping with the region R2 shown in FIG. 5 has the lowest arrangement density of a plurality of wirings. On the other hand, in the region overlapping with the region R3 and the region R4, since the wiring arrangement density is high, a large number of through conductors TV cannot be arranged. Therefore, as shown in FIG. 6, the number of the plurality of through conductors TV arranged in the region R2 is larger than the number of the plurality of through conductors TV arranged in the regions R3 and R4. As a result, the arrangement density of the plurality of through conductors TV arranged in the region R2 is higher than the arrangement density of the plurality of through conductors TV arranged in the regions R3 and R4. In other words, the through conductor TV obstructs the arrangement space of the wiring. Therefore, as shown in FIG. 5, many of the plurality of through conductors TV are arranged close to the outer periphery of the upper surface MRT in plan view.

As a precondition for a large number of wirings routed in the wiring layer WL3 shown in FIG. 2, the characteristic impedances of each of a large number of wiring paths need to satisfy the margins permitted in designing. When the characteristic impedance is set to, for example, $50\Omega$, each of the plurality of wirings needs to have a certain wiring width. As will be described later, in the present embodiment, a plurality of through conductors TV2 for supplying a driving potential to the input/output circuit IOL of the logic chip LC1 is arranged in the region R3 shown in FIG. 5. As described above, in the wiring layer WL3 (see FIG. 2), the region overlapping with the region R3 is a region in which wiring is densely arranged. When a plurality of through conductors TV2 are arranged in an area in which wiring is densely arranged, wiring widths need to be narrowed in order to secure space for arranging the through conductors TV2. In consideration of the characteristic impedance of the wiring path, it is better to shorten the portion where the wiring width is narrow. Therefore, in the present embodiment, in the region R3, the plurality of through conductors TV2 are arranged at close distances along the wiring path in the wiring layer WL3. As a result, the arrangement density of the plurality of through conductors TV arranged in the region R3 is higher than the arrangement density of the plurality of through conductors TV arranged in the region R4.

When a large number of through conductors TV are arranged in the region R2, a large number of wires electrically connecting the region R1 in which the logic chip LC1 is arranged and the plurality of through conductors TV arranged in the region R2 are provided in the wiring portion WP1 (see FIG. 2). The wiring WSG2 shown in FIG. 7, which will be described later, corresponds to the above-mentioned multiple wirings. In the case of the present embodiment, since the arrangement density of the through conductor TV in the region R3 is low, a space for arranging a large number of wirings can be secured at a position where the wiring portion WP1 overlaps with the region R3.

Each of the plurality of through conductors TV is not necessarily arranged at equal intervals in each region. In the present embodiment case, a space for arranging a large number of wirings may be ensured. As long as a space for arranging a large number of wirings can be secured, for example, two of the plurality of through conductors TV may be specifically arranged at a narrow pitch in the region R4. Therefore, the arrangement density of the through conductors TV described above is calculated by using the total area of each region as a denominator and the number of the through conductors TV arranged in each region as a molecule.

However, in a simple manner, the calculation can be performed as follows. For example, four through conductors TV adjacent to each other are arbitrarily extracted in each region, and the area of the region where the four through conductors TV are arranged is calculated as a denominator and 4 is calculated as a molecule. When the arrangement density of the through conductor TV is defined by the calculation methods described above, by lowering the arrangement density of the through conductor TV in the region R4, a large number of wirings can be arranged at positions overlapping with the region R4 in the wiring portion WP1 shown in FIG. 2.

As another method of simply calculating, the following method can be used. That is, among the plurality of solder balls SB1 shown in FIG. 3, four solder balls SB1 adjacent to each other (2 rows×2 columns) are selected. The area of a region in which the selected four solder balls SB1 are arranged is defined as a denominator, and the number of through conductors TV arranged at locations overlapping the region is defined as a numerator. When the arrangement density of the through conductor TV is defined by the calculation methods described above, by lowering the arrangement density of the through conductor TV in the region R4, a large number of wirings can be arranged at positions overlapping with the region R4 in the wiring portion WP1 shown in FIG. 2.

In the present embodiment, the plurality of through conductors TV is electrically connected to the logic chip LC1 and include a plurality of through conductors TV1 through which a signal is transmitted. The plurality of through conductor TV includes a plurality of through conductor TV2 electrically connected to the logic chip LC1 and supplying a driving potential to the input/output circuit IOL of the logic chip LC1. The plurality of through conductors TV are electrically connected to the memory component MP (see FIG. 4) and include a plurality of through conductors TV3 for supplying a driving potential to the memory component MP (see FIG. 4). The plurality of through conductors TV includes a plurality of through conductors TVS electrically connected to the logic chip LC1 and the memory component MP and supplying a reference potential to each of the logic chip LC1 and the memory component MP. The plurality of through conductors TV1 are arranged in the region R2 in the largest number. The plurality of through conductors TV2 are arranged in the region R3 in the largest number. The plurality of through conductors TV3 are arranged in the region R4 most frequently.

The plurality of solder balls SB1 shown in FIG. 3 have a plurality of solder balls SB1$sg$ included in the signal-transmitting path SGP2, a solder ball SB1$vs$ included in the reference potential supply path VSP, a solder ball SB1$v1$ included in the power supply potential supply path VDL1P, a solder ball SB1$v2$ included in the power supply potential supply path VDL2P, and a solder ball SB1 included in the power supply potential supply path VDMP. Although not illustrated, the wiring portion WP2 is a wiring member having a single wiring layer. Each of the plurality of solder balls SB1 is electrically connected to the plurality of through conductors TV (see FIG. 2) via conductor patterns formed on the wiring layer WL4 (see FIG. 2) of the wiring portion WP2.

Among the plurality of solder balls SB1 shown in FIG. 3, the number of solder balls SB1$sg$ is larger than the SB1 of solder balls through which other types of currents flow. Therefore, on the lower surface WP2$b$ of the interconnection portion WP2, the plurality of solder balls SB1$sg$ are disposed in the peripheral area on the lower surface WP2$b$ in the largest number. In the embodiment shown in FIG. 3, if the arrangement of the solder balls SB1 is defined as the first row, the second row, the third row, . . . in order from the outermost circumference, all of the solder balls SB1$sg$ are arranged between the first row and the fifth row in the arrangement of the solder balls SB1. However, in the embodiment shown in FIG. 3, the solder balls SB1$vs$, SB1$vm$ and SV1$v2$ are arranged between the first to fifth rows in addition to the solder balls SB1$sg$. When a plurality of solder balls SB1$sg$ are collectively arranged in the peripheral area on the lower surface WP2$b$ of the wiring portion WP2, there is an advantage that the wiring layout of the signal-transmitting path can be easily simplified in a mounting substrate (not shown).

The solder balls SB1$vs$ included in the reference potential supply path VSP are arranged in the central area of the lower surface WP2$b$. The soldering ball SB1$vs$ is disposed between the power supply potential supply path and the signal-transmitting path in addition to the central area. The plurality of solder balls SB1$v1$ included in the power supply potential supply path VDL1P are disposed between a central region in which the plurality of solder balls SB1$vs$ are disposed and a peripheral region in which the plurality of solder balls SB1$sg$ are disposed. The plurality of solder balls SB1$vm$ included in the power supply potential supply path VDMP are disposed between a region in which the plurality of solder balls SB1$v1$ are disposed and a peripheral region in which the plurality of solder balls SB1$sg$ are disposed in the X-direction. The plurality of solder balls SB1$vm$ are arranged between a central region in which the plurality of solder balls SB1$vs$ are arranged and a peripheral region in which the plurality of solder balls SB1$sg$ are arranged in the Y direction perpendicular to the X direction. The plurality of solder balls SB1$v2$ included in the power supply potential supply path VDL2P are disposed between a central region in which the plurality of solder balls SB1$vm$ are disposed and a peripheral region in which the plurality of solder balls SB1$sg$ are disposed in the Y-direction. The plurality of soldering balls SB1$v2$ are arranged to extend in the Y-direction.

When a plurality of solder balls SB1$sg$ are collectively arranged in the peripheral region on the lower surface WP2$b$ of the wiring portion WP2 as in the electronic device ED1, if the plurality of through conductors TV1 are arranged in the region R2 in the largest number as shown in FIG. 6, the length of the wiring for electrically connecting the through conductor TV1 and the solder ball SB1$sg$ (refer to FIG. 3) in the wiring portion WP2 (see FIG. 2) can be shortened. In addition, the wiring layout can be simplified by shortening the length of the wiring that electrically connects the through conductor TV1 and the solder ball SB1$sg$. As a result, an increase in the number of wiring layers in the wiring portion WP2 can be suppressed.

The through conductor TVS shown in FIG. 6 is included in a reference potential supply path VSP for supplying a reference potential. The reference potential is used as a reference potential of a voltage for driving various circuits, and may also be used as an electromagnetic shield of a signal-transmitting path or a reference path of a signal-transmitting path. In the example shown in FIG. 5, the through conductor TVS is arranged in each of the regions R2, R3, and R4.

As shown in FIG. 6, the number of through conductors TV arranged in the region R2 is larger than the number of through conductors TV arranged in the region R3 and the number of through conductors TV arranged in the region R4. In this instance, in the wiring portion WP1 (see FIG. 2), a large number of wirings need to be arranged at a position overlapping the region R3 and a position overlapping the region R4. The number of wirings connected to the logic chip LC1 increases as the number is closer to the logic chip LC1. Therefore, considering only the space for arranging the wiring, it is preferable that the number of through conductors TV arranged in the region R4 is larger than the number of through conductors TV arranged in the region R3.

However, in the present embodiment, the number of through conductors TV arranged in the region R3 is larger than the number of through conductors TV arranged in the region R4. The plurality of through conductors TV2 included in the power supply potential supply path VDL2P connected to the input/output circuit IOL of the logic chip LC1 is arranged in the region R3 in the largest number. The region R3 is the region closest to the region R1 among the regions R2, R3, and R4. The region R3 is a region adjacent to the region R1. In order to stabilize the operation of the input/output circuit IOL, it is preferable to reduce impedances such as resistances or inductances in the power supply potential supply path VDL2P, which is a path for supplying power for driving the input/output circuit IOL. By arranging the plurality of through conductors TV2 in the region R3, the path length of the power supply potential supply path VDL2P can be shortened. That is, according to the present embodiment, the operation of the input/output circuit IOL can be stabilized by reducing the impedance of the power supply potential supply path VDL2P.

<Wiring Layout>

Figure 7:
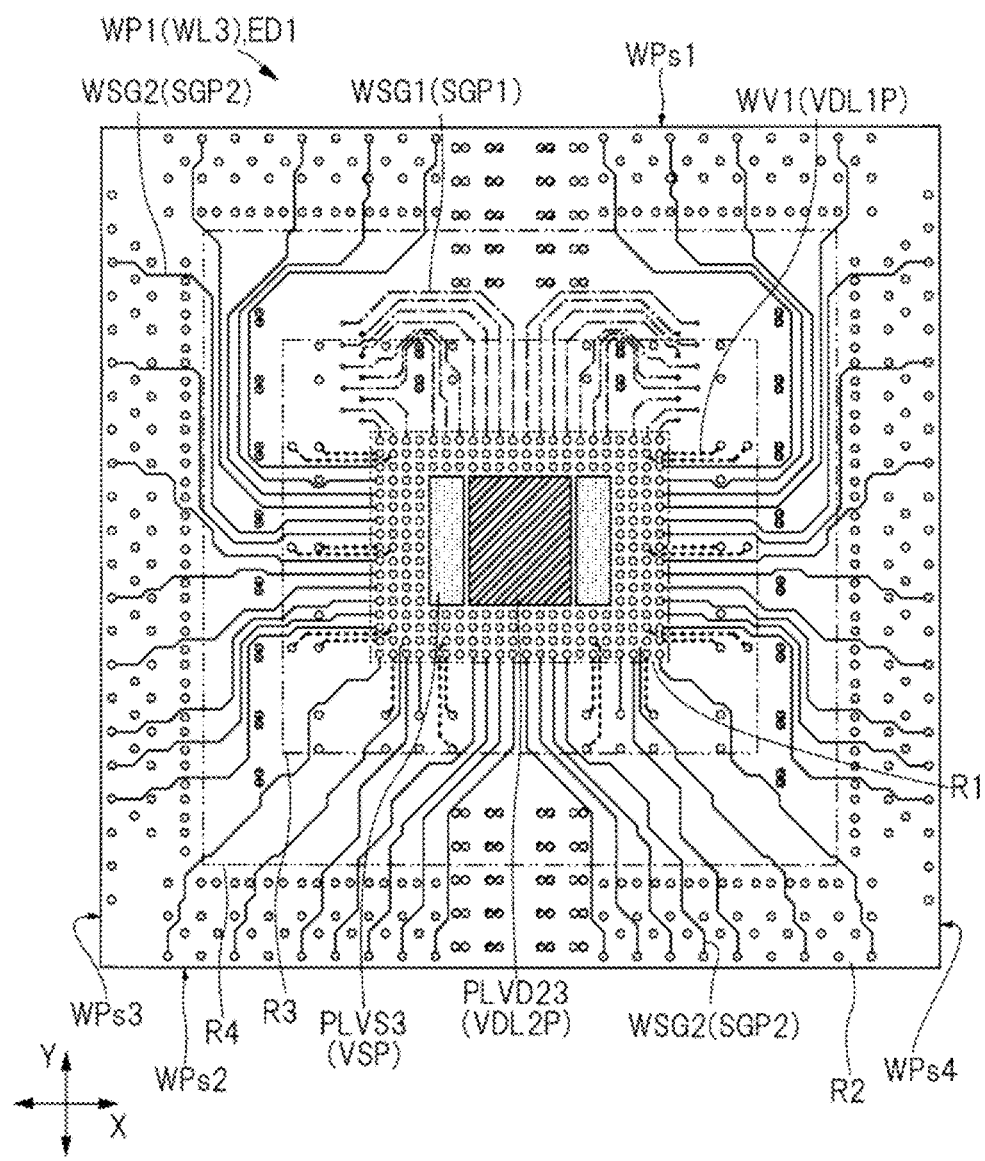
FIG. 7 is a plan view showing examples of wiring layouts in the lowermost layer of the wiring portion on the sealing body shown in FIG. 2.
Figure 8:
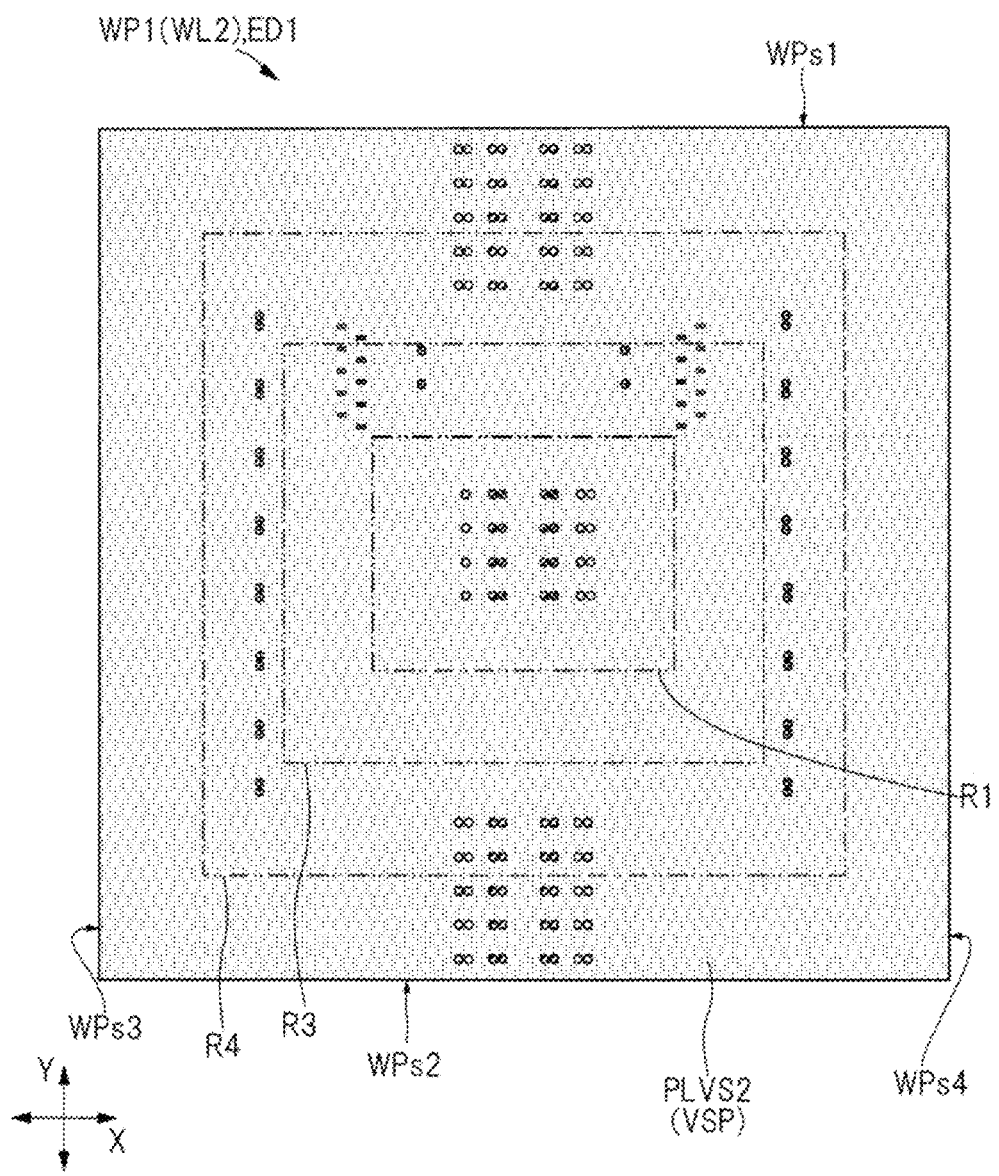
FIG. 8 is a plan view showing examples of layouts of wiring layers between an uppermost layer and a lowermost layer of a wiring portion on the sealing body shown in FIG. 2.
Figure 9:
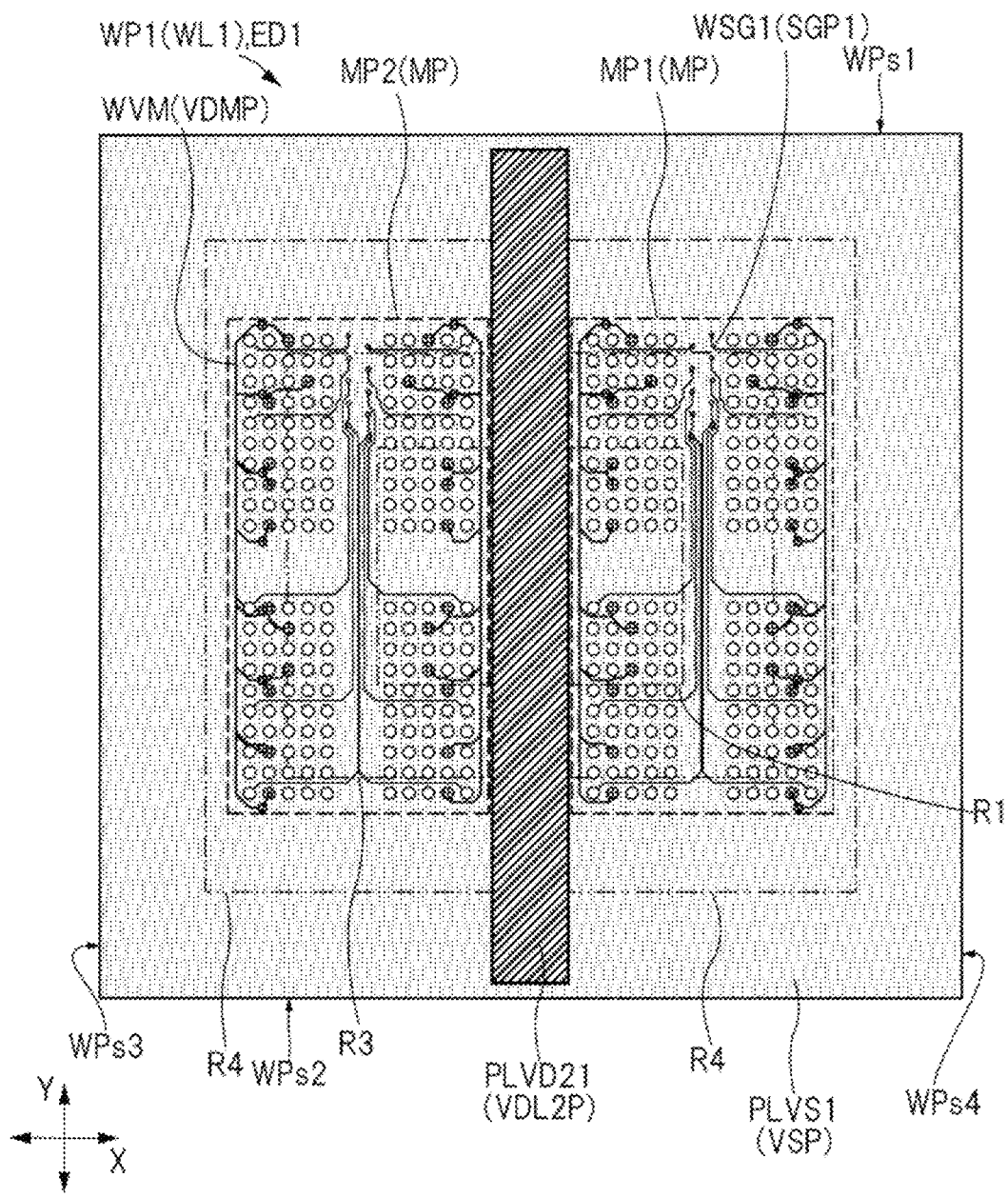
FIG. 9 is a plan view showing examples of layouts of wiring layers in the uppermost layer of the wiring portion on the sealing body shown in FIG. 2.

FIG. 7 is a plan view showing an exemplary wiring layout of the lowermost layer of the wiring portion on the sealing body shown in FIG. 2. FIG. 8 is a plan view showing examples of layouts of wiring layers between the uppermost layer and the lowermost layer of the wiring portion on the sealing body shown in FIG. 2. FIG. 9 is a plan view showing examples of layouts of the uppermost wiring layer of the wiring portion on the sealing body shown in FIG. 2. FIGS. 7 to 9 illustrate a part of a large number of wirings formed in each wiring layer. In FIGS. 7 to 9, in order to make it easy to distinguish the types of currents flowing through a plurality of conductor patterns, the conductor patterns are patterned according to the same rules as in FIGS. 5 and 6. In FIG. 9, the conductor patterns shown in white are pads included in the signal-transmitting path SGP1 shown in FIG. 4 and connected to the terminals PDM and PDM of the memory component MP via the solder bumps SB2.

In addition, in FIG. 7, in order to make it easy to distinguish the type of the current flowing through the wiring, the wiring type is distinguished. More specifically, a plurality of wirings WSG1 included in the signal-transmitting path SGP1 connected to the memory component MP (see FIG. 4) are indicated by a dashed-dotted line. The signal-transmitting path SGP2 connected to the logic chip LC1 (refer to FIG. 4) and the solder ball SB1 (see FIG. 4) without passing through the memory component MP is indicated by a solid line. The interconnection WV1 included in the power supply potential supply path VDL1P connected to the input/output circuit IOL of the logic chip LC1 is indicated by a dotted line.

In FIG. 9, the wires WVM included in the power supply potential supply path VDMP for supplying the power supply potential to the memory component MP (see FIG. 4) are indicated by solid lines. In FIG. 9, the interconnection WSG1 included in the signal-transmitting path SGP1 is indicated by a solid line. In FIGS. 7 to 9, the boundaries of the regions R1 to R4 described with reference to FIG. 5 are indicated by two-dot chain lines.

As shown in FIG. 5, the upper surface MRt of the sealing body MR has a side MRs1, a side MRs2 on the opposite side of the side MRs1, a side MRs3 crossing the side MRs1 and the side MRs2, and a side MRs4 on the opposite side of the side MRs3. The side MRs1 and the side MRs2 extend in the X-direction. The side MRs3 and the side MRs4 extend in the Y direction intersecting the X direction (perpendicular in FIG. 5).

As shown in FIGS. 7 to 9, the upper surface MRt of the interconnection portion WP1 has a side MRs1, a side MRs2 on the opposite side of the side MRs1, a side MRs3 intersecting the side MRs1 and the side MRs2, and a side WP1 on the opposite side of the side MRs3. The side MRs1 and the side MRs2 extend in the X-direction. The side MRs3 and the side MRs4 extend in the Y direction intersecting the X direction (perpendicular in FIG. 5). The side MRs1 of the upper surface MRt shown in FIG. 5 overlaps the side WPs1 in FIGS. 7 to 9. The side MRs2 in FIG. 5 overlaps the side WPs2 in FIGS. 7 to 9. The side MRs3 in FIG. 5 overlaps the side WPs3 in FIGS. 7 to 9. The side MRs4 in FIG. 5 overlaps the side WPs4 in FIGS. 7 to 9.

In this section, first, the layouts of the signaling paths SGP1 and SGP2 shown in FIG. 4 will be described. As shown in FIG. 7, the wiring layer WL3 of the wiring portion WP1 have a plurality of wirings WSG1 included in a plurality of signal-transmitting paths SGP1 and a plurality of wirings WSG2 included in a plurality of signal-transmitting paths SGP2. One end of each of the plurality of wirings WSG2 is connected to the conductor pattern in the region R1, and the other end is connected to the conductor pattern in the region R2. Each of the plurality of conductive patterns in the region R1 is disposed on the solder bumps SB3 shown in FIG. 2. Each of the plurality of conductor patterns in the region R2 is connected to the plurality of through conductors TV shown in FIG. 5. Among the plurality of conductor patterns in the area R2, the conductor pattern to which the end portion of the interconnect WSG2 is connected is electrically connected to the through conductor TV1 shown in FIG. 5. In other words, in the present embodiment, the wiring WSG2 for electrically connecting the terminal PDL of the logic chip LC1 and the through conductors TV shown in FIG. 2 is routed only by the wiring layer WL3. The wiring WSG2 is not formed in the wiring layer WL1 shown in FIG. 9 and the WL2 shown in FIG. 8.

When each of the plurality of wiring WSG2 is routed only by the wiring layer WL3, the following effects can be obtained. As shown in FIG. 7, a plurality of wirings WSG1 included in the signal-transmitting path SGP1 are formed in the wiring layer WL3. In the wiring layer WL3, the plurality of wirings WSG1 and the plurality of wirings WSG2 do not cross each other. As shown in FIG. 8, the wiring layer WL2 of the wiring portion WP1 have a conductive pattern PLVS2 to which the reference potential VS (see FIG. 4) is supplied. The conductor pattern PLVS2 is a conductor pattern having a large area. The conductor pattern PLVS2 has the largest area among the conductor patterns included in the interconnection portion WP1. The large-area conductive pattern PLVS2 is served as a shielding layer for reducing the noise of each of the plurality of signal-transmitting paths SGP2 shown in FIG. 7. The PLVS2 of the conductive patterns shown in FIG. 8 overlaps with each of the plurality of wirings WSG2 shown in FIG. 7. In this instance, it is possible to suppress the effect of the plurality of signal-transmitting paths SGP2 on the WL1 of wiring layers shown in FIG. 9. As a result, the degree of freedom of layouts in the wiring layer WL1 can be improved. For example, even if the signal-transmitting path SGP1 formed in the wiring layer WL1 and the signal-transmitting path SGP2 formed in the wiring layer WL3 overlap with each other, the electromagnetic shielding effect of the conductive pattern PLVS2 of the wiring layer WL2 can reduce the mutual noise effect between the signal-transmitting paths.

Although not shown in FIG. 7 for the sake of clarity, in the wiring layer WL3, a conductor pattern to which a reference potential is supplied is arranged in a portion where there is no conductor pattern included in the signal-transmitting path or the power supply potential transmission path. As shown in FIG. 9, the wiring layer WL1 of the wiring portion WP1 have a conductive pattern PLVS1 to which the reference potential VS (see FIG. 4) is supplied. The conductor pattern PLVS1 is a conductor pattern having a large area. The conductor pattern PLVS1 has an area next larger than that of the conductor pattern PLVS2 shown in FIG. 8 among the conductor patterns included in the interconnection portion WP1.

As shown in FIG. 7, one end of each of the plurality of wirings WSG1 is connected to the conductor pattern in the region R1, and the other end is connected to the conductor pattern arranged in the region R3 or R4. Of the conductor patterns arranged in the regions R3 or R4, the conductor patterns connected to the wiring WSG1 are connected to the wiring WSG1 of the wiring layer WL1 shown in FIG. 9 via wirings (interlayer conductive paths) connecting the wiring layers WL1, WL2 and WL3 to each other.

Further, it is preferable that a plurality of wiring layers WSG1 are provided on the wiring layers WL3 in the following points. As shown in FIG. 9, a wide conductive pattern PLVD21 extending along the Y-direction is arranged in the center of the interconnection layer WL1. Although the reason for providing the conductor pattern PLVD21 will be described later, the conductor pattern PLVD21 overlaps the conductor pattern to which the end portions of the plurality of wirings WSG1 are connected in the region R1 shown in FIG. 7. The plurality of wirings WSG1 provided in the wiring layer WL3 extends from a region overlapping with the conductive pattern PLVD21 shown in FIG. 9 toward a region not overlapping with each other. When the plurality of wirings WSG1 shown in FIG. 7 are not provided, if the conductor pattern PLVD21 extends so as to straddle the region R1 as shown in FIG. 9, the conductor pattern PLVD21 and the signal-transmitting path SGP1 overlap each other. As shown in the present embodiment, since the plurality of wirings WSG1 provided in the wiring layer WL3 extend from the region overlapping with the conductor pattern PLVD21 shown in FIG. 9 toward the region not overlapping with each other, the conductor pattern PLVD21 can extend along the Y-direction so as to straddle the region R1.

Each of the plurality of wiring WSG1 formed on the wiring layer WL3 overlaps with the conductor patterns PLVS2 of the wiring layer WL2 shown in FIG. 8. Therefore, it is possible to suppress the signal-transmitting path SGP1 in the wiring layer WL3 from being affected by noises caused by the conductor patterns PLVD21 arranged on the wiring layer WL1.

Next, a power supply potential supply path VDL2P for supplying a power supply potential to the core circuit CRC of the logic chip LC1 shown in FIG. 4 will be described. In the case of the core circuit CRC, there is a tendency that the instantaneous change in power demand is large as compared with the input/output circuit IOL. Thus, in order to stably supply necessary power in response to an instantaneous change in power demand, it is preferable to provide a conductor pattern having a large area in the vicinity of the power consumption circuit.

In the present embodiment, as shown in FIG. 5, the plurality of through conductors TV have a plurality of through conductors TV4 electrically connected to the logic chip LC1 via a conductor pattern PLVD21 formed on the wiring layer WL1 (see FIG. 9) of the wiring portion WP1 (see FIG. 9). The through conductor TV4 supplies a driving potential to the core circuit CRC of the logic chip LC1 shown in FIG. 4. Part of the plurality of through conductors TV4 is arranged between the side MRs1 of the upper surface MRt of the sealing body MR and the region R1 from the side MRs1 toward the region R1 so as to be adjacent to each other. The other portions of the plurality of through conductors TV4 are arranged between the side MRs1 of the upper surface MRt of the sealing body MR and the region R1 from the side MRs1 toward the region R1 so as to be adjacent to each other.

Each of the plurality of through conductors TV4 is arranged at a position overlapping with the conductor patterns PLVD21 formed on the interconnect layer WL1 shown in FIG. 9. Therefore, the path length of the power supply potential supply path VDL2P connecting the plurality of solder balls SB1v2 shown in FIG. 3 and the conductive pattern PLVD21 shown in FIG. 9 can be shortened.

The conductive pattern PLVD21 shown in FIG. 9 extends along the Y-direction from the side WPs1 to the side WPs2 of the interconnect portion WP1. The conductive pattern PLVD21 overlaps all of the regions R1, R2, R3, and R4. When the conductive pattern PLVD21 having a large area is provided on the area R1, required power can be supplied in response to a sudden change in power demand of the core circuit CRC of the logic chip LC1 shown in FIG. 4.

As shown in FIG. 2, the conductive pattern PLVD21 is arranged at a position overlapping the region sandwiched between the memory components MP1 and MP2. In this instance, it is possible to suppress mutual interferences between the signal-transmitting path SGP1 or the power supply potential supply path VDMP shown in FIG. 4 and the power supply potential supply path VDL2P.

In the embodiment shown in FIG. 5, the plurality of through conductors TV4 are arranged in the region R2 and the region R4 of the upper surface MRt, and are not arranged in the region R3. As described above, since the through conductor TV4 are concentrated on the outer periphery of the sealing body MR, the layout of each of the plurality of wirings WSG1 and WSG2 in the wiring layer WL3 shown in FIG. 7 is not hindered.

Further, in the embodiment shown in FIG. 5, the plurality of through conductors TV4 are not arranged between the side MRs3 and the region R1, and between the side MRs4 and the region R1. In the wiring layer WL3 of the wiring portion WP1 shown in FIG. 7, regions between the side WPs3 and the region R1 and between the side WPs4 and the region R1 can be used as spaces for routing a large number of wirings.

Further, in the wiring layer WL3 shown in FIG. 7, the conductor pattern PLVD23 is arranged at a position overlapping with the conductor pattern PLVD21 shown in FIG. 9. The conductor pattern PLVD23 is smaller than the conductor pattern PLVD21, but has a large area. A plurality of terminals PDL included in the logic chip LC1 shown in FIG. 2 are connected to one conductive pattern PLVD23 via a plurality of solder bumps SB3. As described above, by providing the large-area conductive patterns PLVD21, PLVD23 in the power supply potential supply path VDL2P, it becomes easy to cope with a sudden change in power demand.

Next, the power supply potential supply path VDMP for supplying a driving potential of the memory component MP shown in FIG. 4 will be described. As shown in FIG. 5, the through conductor TV3 included in the power supply potential supply path VDMP is arranged in the region R4 in the largest number. However, the through conductors TV3 arranged between the side MRs1 of the upper surface MRt and the region R1 are arranged in the region R3. In this instance, a region overlapping with the region R4 between the side WPs1 and the region R1 shown in FIG. 7 can be used as a lead-out space for a plurality of wirings WSG1.

As shown in FIG. 5, each of the plurality of through conductors TV3 overlaps with the memory component MP1 or MP2 in a transparent plan view seen from the memory component MP-side. In this instance, the path length of the power supply potential supply path VDMP can be shortened. As is apparent from comparison with the example of FIG. 14 described later, the length of the wiring WVM shown in FIG. 9 is shorter than that of the wiring WVM shown in FIG. 14. That is, according to the present embodiment, the operation of the RAM can be stabilized by reducing the impedance of the power supply potential supply path VDMP. In the present embodiment examples, all the through conductors TV3 overlap with the memory component MP1 or the memory component MP2. However, as a modified example, some of the plurality of through conductors TV3 may not overlap with the memory components MP1 and MP2.

As described above, the electronic device ED1 described with reference to FIGS. 1 to 9 can improve the performance of the electronic device ED1 by devising the layouts of the plurality of through conductors TV shown in FIG. 5. The performance of the electronic device ED1 improved by the electronic device ED1 includes, for example, one or more of the transmission characteristics of the signal-transmitting path SGP1, SGP2, the power supply potential supply path VDL1P, VDL2P, and the VDM shown in FIG. 4.

Figure 10:
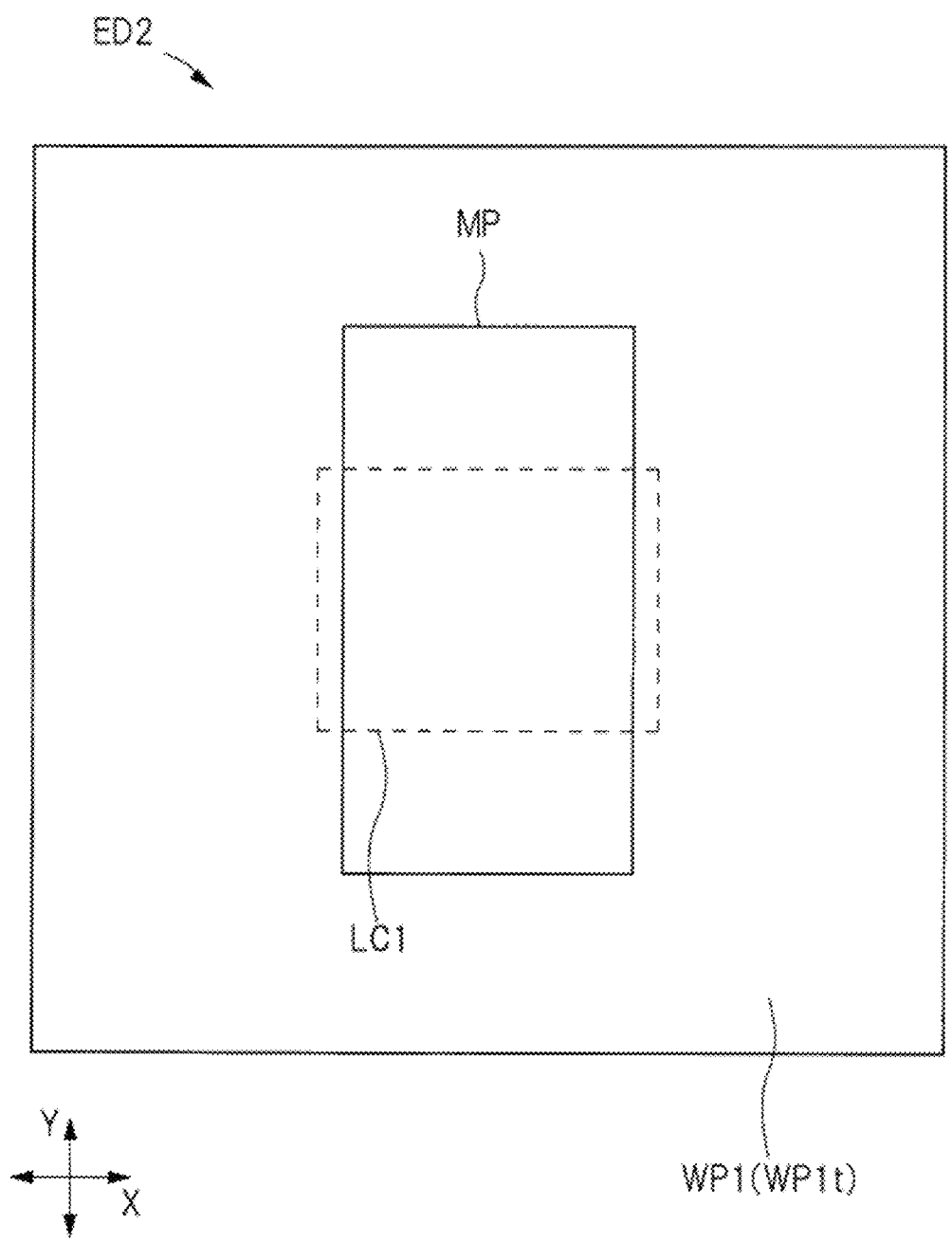
FIG. 10 is an upper surface diagram of an electronic device that is a modified example to FIG. 1.
Figure 11:
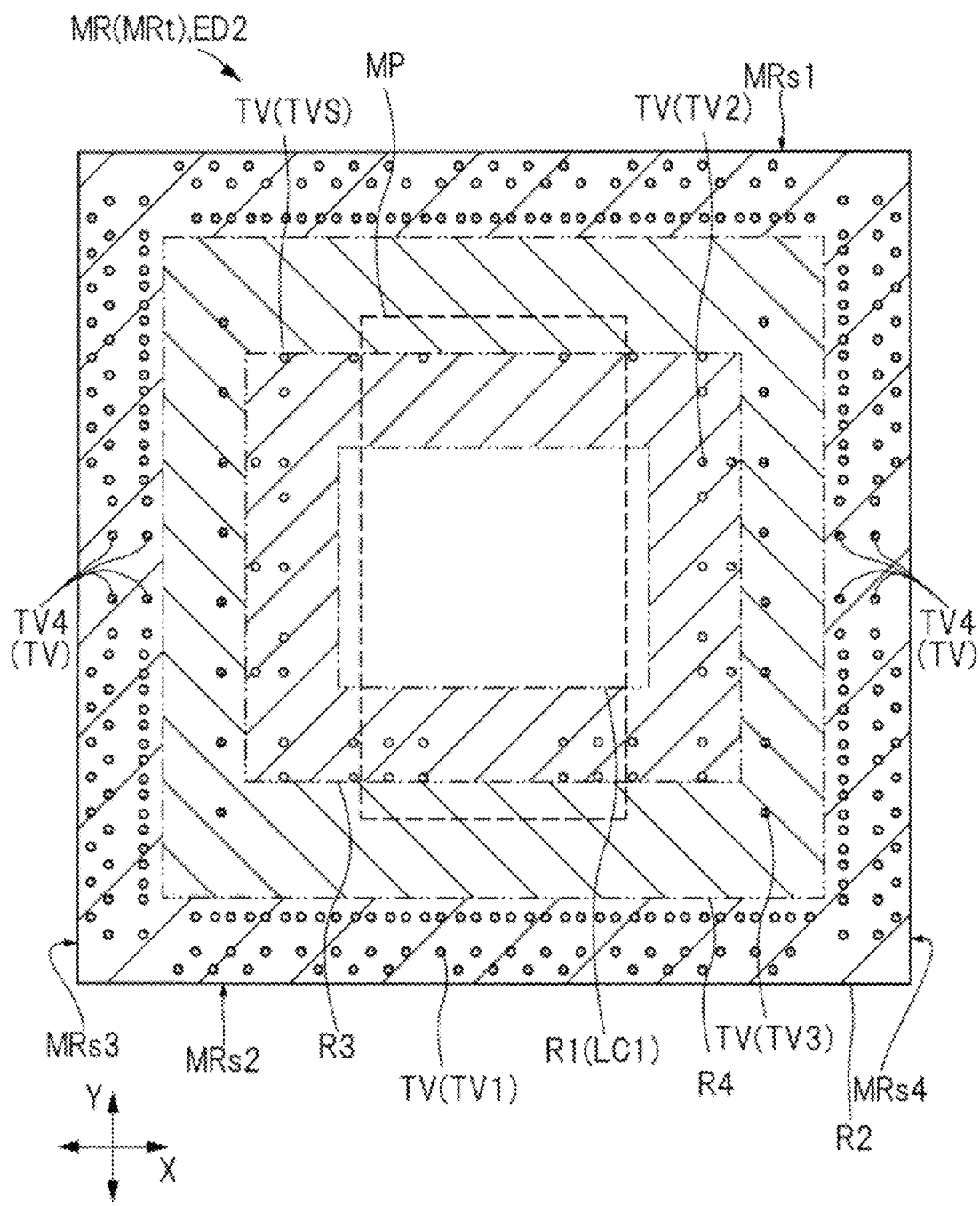
FIG. 11 is a plan view of the sealing body of the electronic device shown in FIG. 10 as viewed from the upper surface.
Figure 12:
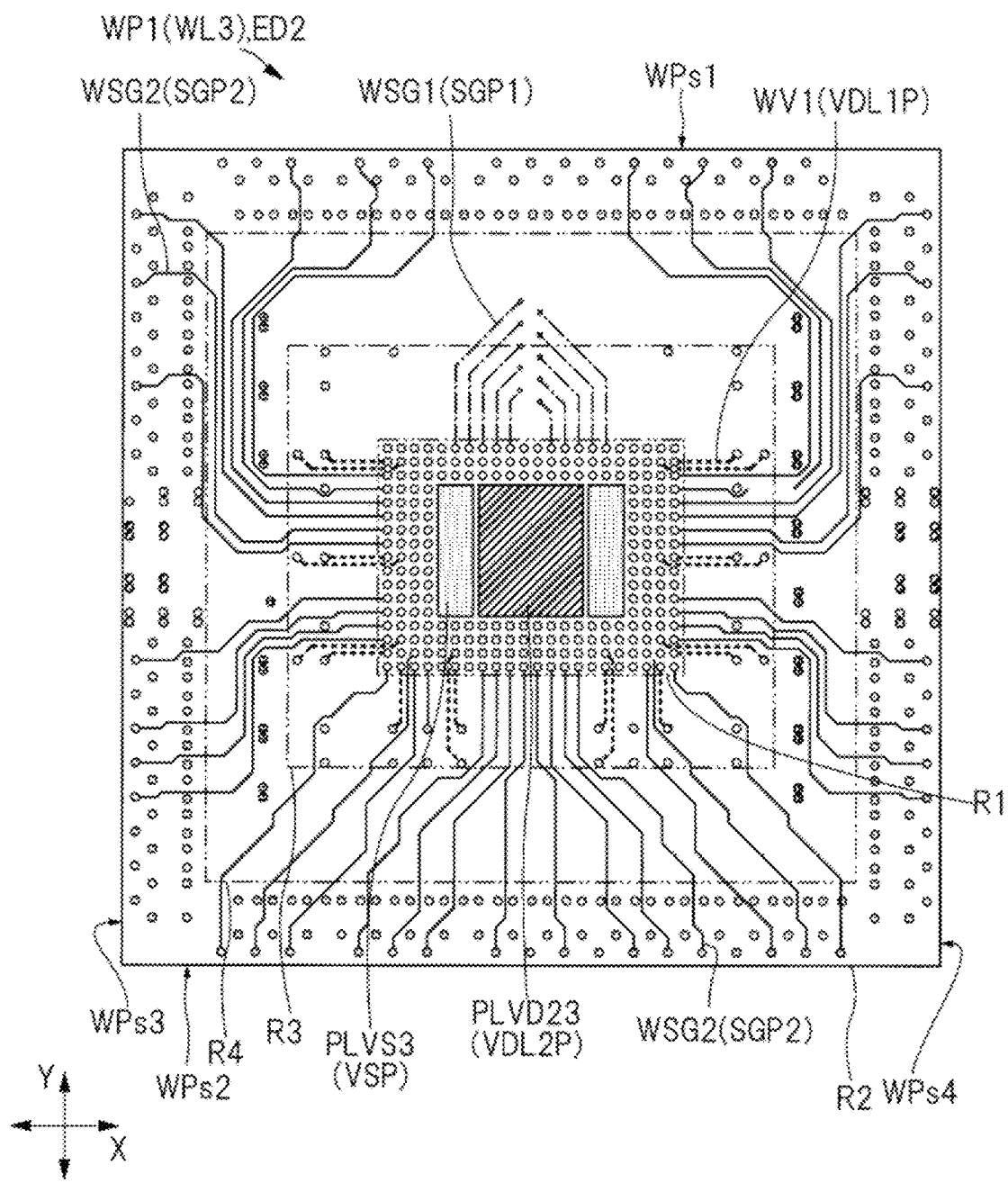
FIG. 12 is a plan view showing examples of wiring layouts in the lowermost layer of the wiring portion on the sealing body shown in FIG. 11.
Figure 13:
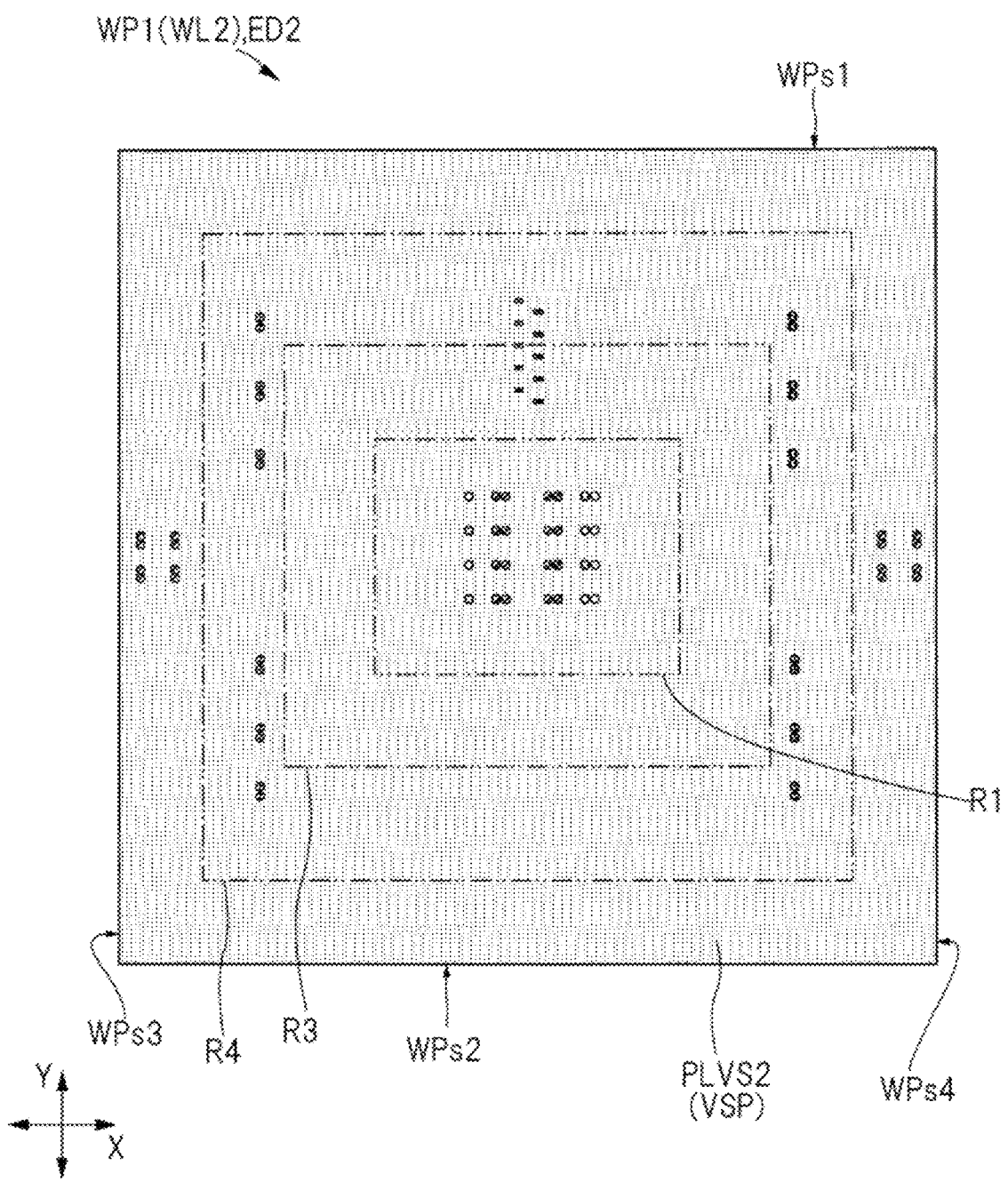
FIG. 13 is a plan view showing examples of layouts of wiring layers between an uppermost layer and a lowermost layer of the wiring portion shown in FIG. 12.
Figure 14:
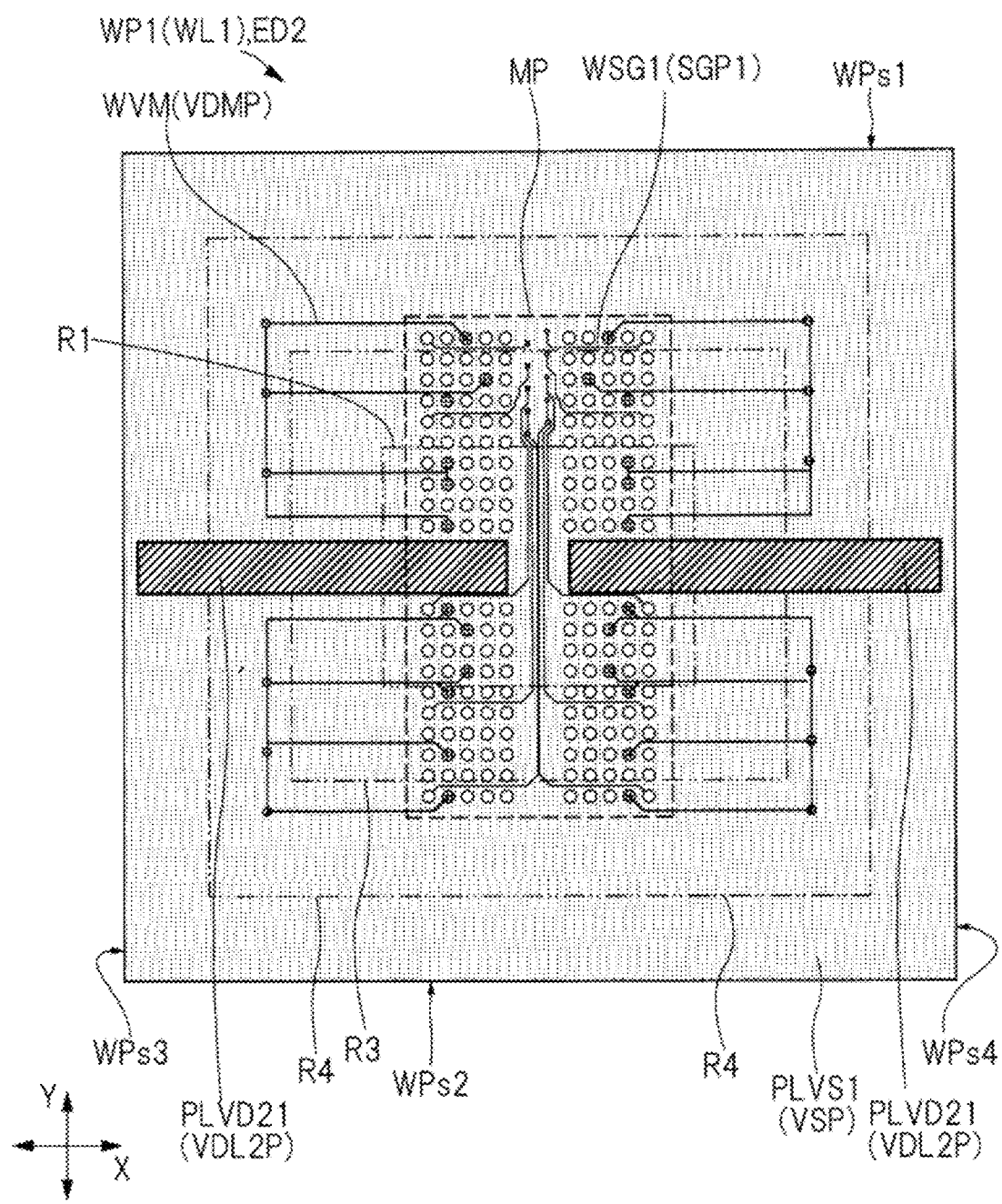
FIG. 14 is a plan view showing examples of layouts of wiring layers in the uppermost layer of the wiring portion shown in FIG. 12.

Next, modified example with respect to the electronic device ED1 described with reference to FIGS. 1 to 9 will be described with reference to FIGS. 10 to 14. FIG. 10 is an upper surface diagram of an electronic device which is a modified example to FIG. 1. FIG. 11 is a plan view when the sealing body of the electronic device shown in FIG. 10 is viewed from the upper surface. FIG. 12 is a plan view showing examples of wiring layouts in the lowermost layer of the wiring portion on the sealing body shown in FIG. 11. FIG. 13 is a plan view showing examples of layouts of wiring layers between the uppermost layer and the lowermost layer of the wiring portion shown in FIG. 12. FIG. 14 is a plan view showing examples of layouts of wiring layers in the uppermost layer of the wiring portion shown in FIG. 12. The upper surface MRt of the sealing body MR shown in FIG. 11 corresponds to the upper surface MRt of the sealing body MR shown in FIG. 5. Each of FIGS. 12 to 14 corresponds to the wiring layer shown in FIGS. 7 to 9. Although FIGS. 11 to 14 are plan view, the conductive patterns are patterned according to the same rules as in FIGS. 5 and 7 to 9.

The electronic device ED2 shown in FIG. 10 differs from the electronic device ED1 shown in FIG. 1 in that one memory component MP is mounted on the upper surface WP1t of the wiring portion WP1. In the electronic device ED2, as compared with the electronic device ED1 shown in FIG. 1, the number of wirings formed in the wiring portion WP1 is small as the number of memory components MPs decreases. However, when the number of wirings included in the wiring portion WP1 is small, the planar area of the wiring portion WP1 (for example, the area of the upper surface WP1t) is reduced. Therefore, the layouts of the plurality of through conductors TV described with reference to FIG. 5 are the same for the electronic device ED2. That is, as shown in FIG. 11, the number of the plurality of through conductors TV arranged in the region R2 is larger than the number of the plurality of through conductors TV arranged in the region R3 and the number of the plurality of through conductors TV arranged in the region R4, respectively. The number of the plurality of through conductors TV arranged in the region R3 is larger than the number of the plurality of through conductors TV arranged in the region R4. The number of the through conductors TV arranged in each of the above-mentioned regions can be expressed as follows. That is, the arrangement density of the plurality of through conductors TV arranged in the region R2 is higher than the arrangement density of the plurality of through conductors TV arranged in the region R3 and the region R4. The arrangement density of the plurality of through conductors TV arranged in the region R4 is lower than the arrangement density of the plurality of through conductors TV arranged in the region R3.

The plurality of through conductors TV includes a plurality of through conductors TV1 electrically connected to the logic chip LC1 and through which a signal is transmitted. The plurality of through conductors TV is electrically connected to the logic chip LC1, and include a plurality of through conductors TV2 for supplying a driving potential to the input/output circuit IOL of the logic chip LC1. The plurality of through conductors TV are electrically connected to the memory component MP (see FIG. 10), and include a plurality of through conductors TV3 for supplying a driving potential to the memory component MP (see FIG. 10). The plurality of through conductor TV includes a plurality of through conductor TVS electrically connected to the logic chip LC1 and the memory component MP and supplying a reference potential to each of the logic chip LC1 and the memory component MP. The plurality of through conductors TV1 are arranged in the region R2 in the largest number. The plurality of through conductors TV2 are arranged in the region R3 in the largest number. The plurality of through conductors TV3 are arranged in the region R4 most frequently.

As shown in FIG. 12, the plurality of wirings WSG1 formed in the wiring layer WL3 are arranged between the side WPs1 of the wiring portion WP1 and the region R1. The plurality of wirings WSG1 are aggregated between the side WPs1 of the wiring portion WP1 and the region R1. Part of the plurality of wires WSG2 is formed so as to surround the region in which the plurality of wirings WSG1 is formed, and is electrically connected to the plurality of through conductors TV1 (refer to FIG. 11) arranged between the side WPs1 and the region R4.

As shown in FIG. 14, in the present modified example, the extending direction of the conductive pattern PLVD21 formed on the interconnect layer WL1 differs from those shown in FIG. 9. As shown in FIG. 14, the conductive pattern PLVD21 included in the electronic device ED2 of the present modified example extends in the X-direction. When one memory component MP is mounted, it is preferable to arrange the memory component MP in the central area of the interconnection portion WP1. In this instance, a part of the plurality of wiring WSG1 formed in the wiring layer WL1 extends along the Y-direction in the central area of the wiring layer WL1. Therefore, in the wiring layer WL1 of the present modified example, each of the two divided conductor patterns PLVD21 is arranged so as to extend in the X-direction.

The electronic device ED2 shown in FIG. 10 is the same as the electronic device ED1 described with reference to FIGS. 1 to 9, except for the differences described above. Therefore, duplicate descriptions of the same structures as those of the electronic device ED1 will be omitted.

Although the invention made by the present inventor has been specifically described based on the embodiment, the present invention is not limited to the above embodiment, and it is needless to say that various modifications can be made without departing from the gist thereof.

What is claimed is:
1. An electronic device comprising:
   a sealing body having a first surface and a second surface opposite to the first surface, and sealing a first semiconductor component;
   a first wiring portion formed on the first surface;
   a second wiring portion formed on the second surface;
   a plurality of through conductors penetrating through the sealing body, and electrically connecting the first wiring portion and the second wiring portion with each other; and a second semiconductor component mounted on the first wiring portion, wherein the first semiconductor component is electrically connected with the second wiring portion via the first wiring portion and the plurality of through conductors, wherein the second semiconductor component is electrically connected with the first semiconductor component via the first wiring portion, wherein the first surface of the sealing body includes:
- a first region in which the first semiconductor component is located,
- a second region located closer to a periphery of the first surface than the first region,
- a third region located between the second region and the first region, and
- a fourth region located between the second region and the third region, wherein a number of the plurality of through conductors located in the second region is larger than each of a number of the plurality of through conductors located in the third region and a number of the plurality of through conductors located in the fourth region, and wherein the number of the plurality of through conductors located in the third region is larger than the number of the plurality of through conductors located in the fourth region.

2. The electronic device according to claim 1,
wherein the plurality of through conductors includes:
- a plurality of first through conductors electrically connected with the first semiconductor component, and transmitting a signal,
- a plurality of second through conductors electrically connected with the first semiconductor component, and supplying a driving potential to an input/output circuit of the first semiconductor component, and
- a plurality of third through conductors electrically connected with the second semiconductor component, and supplying a driving potential to the second semiconductor component, wherein the plurality of first through conductors is arranged most in the second region, and wherein the plurality of second through conductors is arranged most in the third region.

3. The electronic device according to claim 2,
wherein the first wiring portion includes:
- a plurality of first signal-transmitting paths transmitting a signal between the first semiconductor component and the second semiconductor component,
- a plurality of second signal-transmitting paths transmitting a signal between the first semiconductor component and the plurality of first through conductors,
- a first wiring layer on the first surface of the sealing body,
- a second wiring layer stacked on the first wiring layer, and
- a third wiring layer stacked on the second wiring layer, wherein the plurality of first signal-transmitting paths is formed in each of the first wiring layer, the second wiring layer and the third wiring layer, and wherein the plurality of second signal-transmitting paths is formed in the third wiring layer.

4. The electronic device according to claim 3, wherein the plurality of second signal-transmitting paths electrically connects the first semiconductor component and the plurality of first through conductors with each other without going through the first wiring layer and the second wiring layer.

5. The electronic device according to claim 4,
wherein the third wiring layer includes:
- a plurality of first wirings included in the plurality of first signal-transmitting paths, and
- a plurality of second wirings included in the plurality of second signal-transmitting paths, wherein the second wiring layer includes a first conductive pattern transmitting a reference potential, and wherein the first conductive pattern overlaps with each of the plurality of second wirings.

6. The electronic device according to claim 3,
wherein the plurality of through conductors includes a plurality of fourth through conductors electrically connected with the first semiconductor component via a second conductive pattern formed in the first wiring layer of the first wiring portion, and transmitting a driving potential to a core circuit of the first semiconductor component, wherein the first surface of the sealing body has a first side, a second side opposite the first side, a third side crossing each of the first side and the second side, and a fourth side opposite the third side, and wherein ones of the plurality of fourth through conductors are arranged between the first side and the first region such that the ones are arranged side by side, and such that the ones are arranged from beside of the first side toward the first region.

7. The electronic device according to claim 6, wherein the plurality of fourth through conductors is arranged in each of the second region and the fourth region, but not arranged in the third region.

8. The electronic device according to claim 7, wherein the plurality of fourth through conductors is not arranged between the third side and the first region, and not arranged between the fourth side and the first region.

9. The electronic device according to claim 6, wherein the other ones of the plurality of fourth through conductors are arranged between the second side and the first region such that the other ones are arranged side by side, and such that the other ones are arranged from beside of the second side toward the first region.

10. The electronic device according to claim 9, wherein the other ones of the plurality of fourth through conductors are arranged in each of the second region and the fourth region, but not arranged in the third region, and not arranged between the third side and the first region, and not arranged between the fourth side and the first region.

11. The electronic device according to claim 1, wherein, in a transparent plan view from the first wiring portion, the plurality of second through conductors is overlapped with the second semiconductor component.

12. An electronic device comprising:
- a sealing body having a first surface and a second surface opposite to the first surface, and sealing a first semiconductor component;
- a first wiring portion formed on the first surface;
- a second wiring portion formed on the second surface;
- a plurality of through conductors penetrating through the sealing body, and electrically connecting the first wiring portion and the second wiring portion with each other; and
- a second semiconductor component mounted on the first wiring portion, wherein the first semiconductor component is electrically connected with the second wiring portion via the first wiring portion and the plurality of through conductors, wherein the second semiconductor component is electrically connected with the first semiconductor component via the first wiring portion, wherein, in a transparent plan view from the first wiring portion, the first surface includes:
- a first region in which the first semiconductor component is located,
- a second region located closer to a periphery of the first surface than the first region,
- a third region located between the second region and the first region, and
- a fourth region located between the second region and the third region, wherein a wiring density of the plurality of through conductors located in the second region is higher than each of a wiring density of the plurality of through conductors located in the third region and a wiring density of the plurality of through conductors located in the fourth region, and wherein the wiring density of the plurality of through conductors located in the fourth region is lower than the wiring density of the plurality of through conductors located in the third region.

13. The electronic device according to claim 12,
wherein the plurality of through conductors includes:
- a plurality of first through conductors electrically connected with the first semiconductor component, and transmitting a signal,
- a plurality of second through conductors electrically connected with the first semiconductor component, and supplying a driving potential to an input/output circuit of the first semiconductor component, and
- a plurality of third through conductors electrically connected with the second semiconductor component, and supplying a driving potential to the second semiconductor component, wherein the plurality of first through conductors is arranged most in the second region, and wherein the plurality of second through conductors is arranged most in the third region.

14. The electronic device according to claim 13,
wherein the first wiring portion includes:
- a plurality of first signal-transmitting paths transmitting a signal between the first semiconductor component and the second semiconductor component,
- a plurality of second signal-transmitting paths transmitting a signal between the first semiconductor component and the plurality of first through conductors,
- a first wiring layer on the first surface of the sealing body,
- a second wiring layer stacked on the first wiring layer, and
- a third wiring layer stacked on the second wiring layer, wherein the plurality of first signal-transmitting paths is formed in each of the first wiring layer, the second wiring layer and the third wiring layer, and wherein the plurality of second signal-transmitting paths is formed in the third wiring layer.

15. The electronic device according to claim 14,
wherein the plurality of through conductors includes a plurality of fourth through conductors electrically connected with the first semiconductor component via a second conductive pattern formed in the first wiring layer of the first wiring portion, and transmitting a driving potential to a core circuit of the first semiconductor component, wherein the first surface of the sealing body has a first side, a second side opposite to the first side, a third side crossing to each of the first side and the second side, and a fourth side opposite to the third side, and wherein ones of the plurality of fourth through conductors are arranged between the first side and the first region such that the ones are arranged side by side, and such that the ones are arranged from beside of the first side toward the first region.

* * * * *